(12) United States Patent
Basser et al.

(10) Patent No.: US 8,380,280 B2
(45) Date of Patent: *Feb. 19, 2013

(54) NON-INVASIVE IN VIVO MRI AXON DIAMETER MEASUREMENT METHODS

(75) Inventors: Peter J. Basser, Washington, DC (US); Yaniv Assaf, Tel-Aviv (IL)

(73) Assignee: The United States of America, as represented by the Secretary of the Department of Health and Human Services, Washington, DC (US)

( * ) Notice: Subject to any disclaimer, the term of this patent is extended or adjusted under 35 U.S.C. 154(b) by 1010 days.

This patent is subject to a terminal disclaimer.

(21) Appl. No.: 12/114,713

(22) Filed: May 2, 2008

(65) Prior Publication Data

US 2009/0010517 A1    Jan. 8, 2009

Related U.S. Application Data

(63) Continuation-in-part of application No. 10/888,917, filed on Jul. 8, 2004, now Pat. No. 7,643,863.

(60) Provisional application No. 60/485,658, filed on Jul. 8, 2003, provisional application No. 60/571,064, filed on May 14, 2004.

(51) Int. Cl.
    *A61B 5/055*    (2006.01)

(52) U.S. Cl. .................................. 600/410; 324/309
(58) Field of Classification Search .................. 600/410; 324/309
    See application file for complete search history.

(56) References Cited

U.S. PATENT DOCUMENTS

| 6,310,967 | B1 * | 10/2001 | Heine et al. ................. 382/128 |
| 6,463,315 | B1 * | 10/2002 | Klingberg et al. ............ 600/410 |
| 6,529,763 | B1 * | 3/2003  | Cohen et al. ................ 600/410 |
| 7,643,863 | B2 * | 1/2010  | Basser et al. ................ 600/410 |

* cited by examiner

*Primary Examiner* — Jonathan Cwern
(74) *Attorney, Agent, or Firm* — Klarquist Sparkman, LLP

(57) ABSTRACT

Magnetic resonance methods include modeling magnetic resonance signals obtained from specimens at low and high q-values to obtain parameters and distributions of parameters associated with specimen structure and orientation. In evaluation of brain white matter specimens, diffusion within axons can be modeled based on hindered diffusion parallel to an axis of the axon and restricted diffusion perpendicular to the axis. Diffusion exterior to axons can be modeled as hindered diffusion with differing diffusivities parallel to and perpendicular to the axis. Based on extracted parameters and associated model functions, distributions of specimen properties such as intra and extra-axonal principal diffusivities and the corresponding principal directions can be estimated. Features of the axon diameter distribution can also be estimated using this approach.

22 Claims, 22 Drawing Sheets

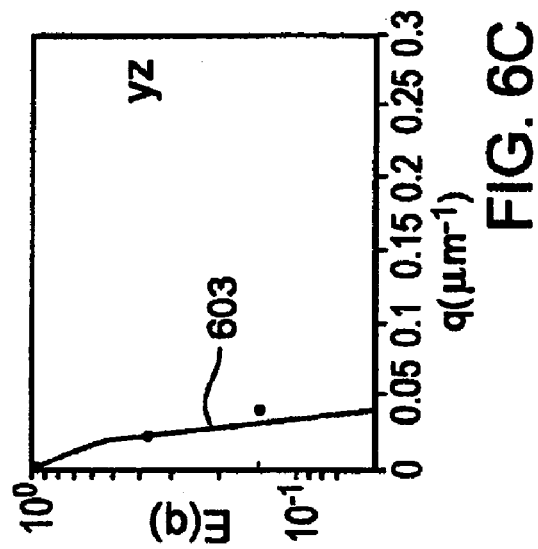
FIG. 6C
FIG. 6B
FIG. 6A
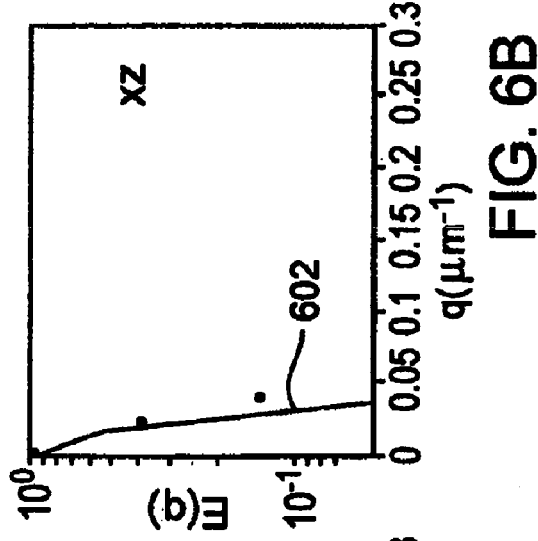
FIG. 6F
FIG. 6E
FIG. 6D
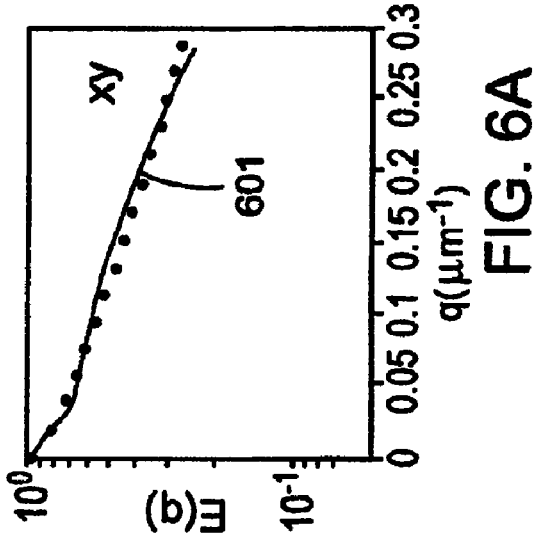

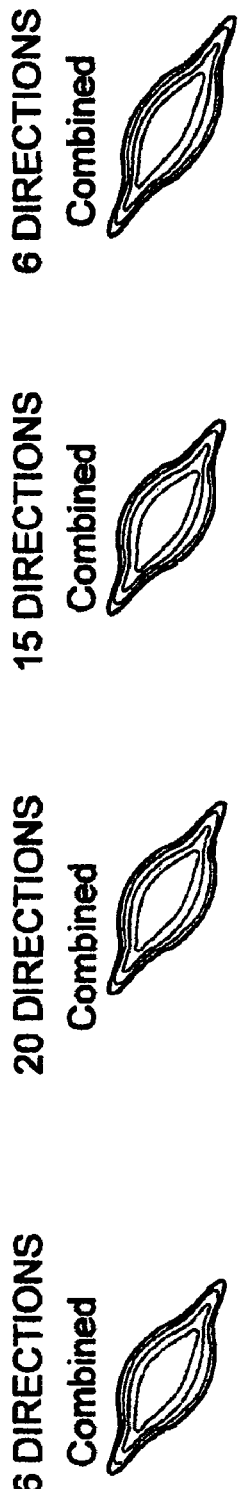
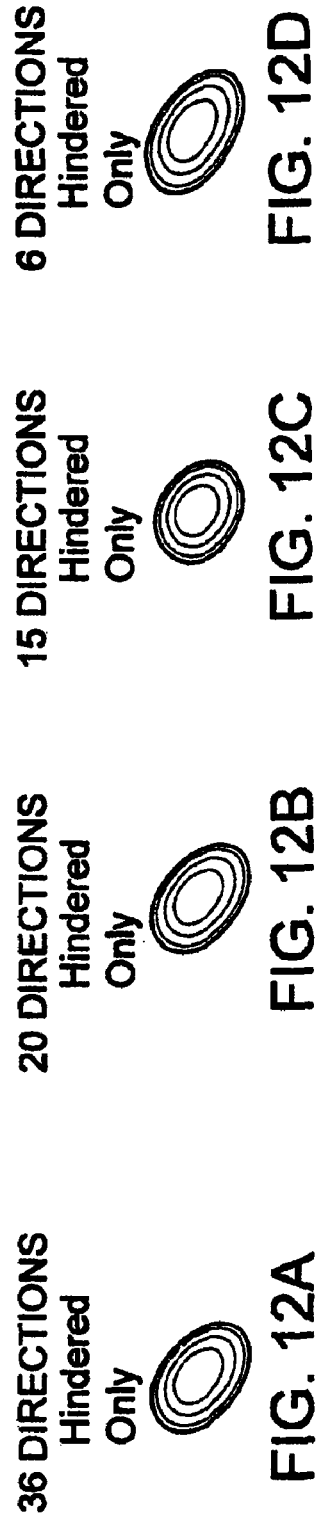
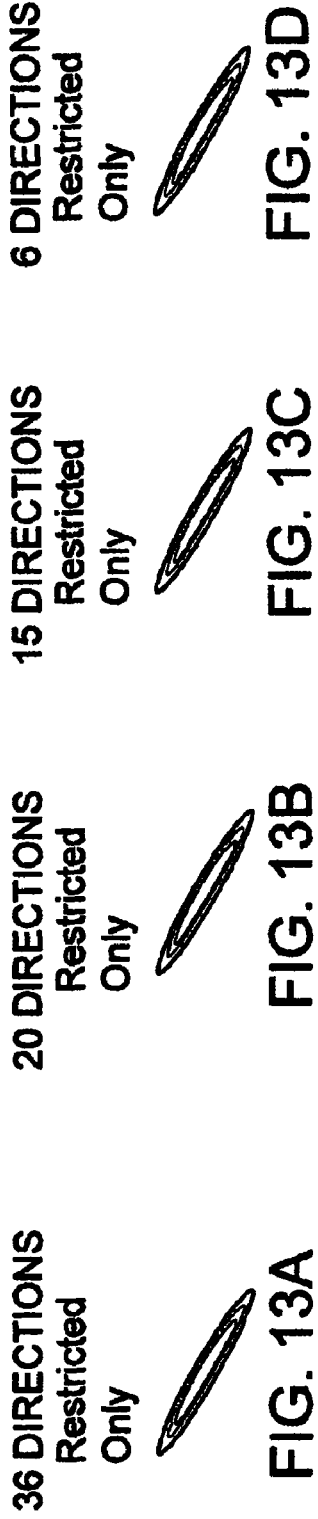
FIG. 11A  FIG. 11B  FIG. 11C  FIG. 11D
36 DIRECTIONS Combined  20 DIRECTIONS Combined  15 DIRECTIONS Combined  6 DIRECTIONS Combined
FIG. 12A  FIG. 12B  FIG. 12C  FIG. 12D
36 DIRECTIONS Hindered Only  20 DIRECTIONS Hindered Only  15 DIRECTIONS Hindered Only  6 DIRECTIONS Hindered Only
FIG. 13A  FIG. 13B  FIG. 13C  FIG. 13D
36 DIRECTIONS Restricted Only  20 DIRECTIONS Restricted Only  15 DIRECTIONS Restricted Only  6 DIRECTIONS Restricted Only

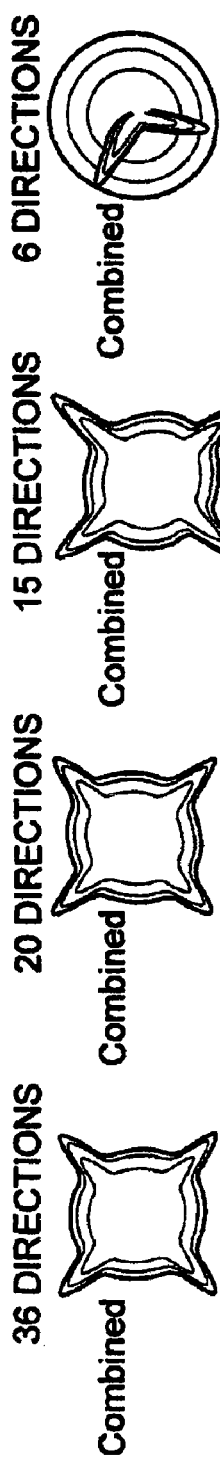
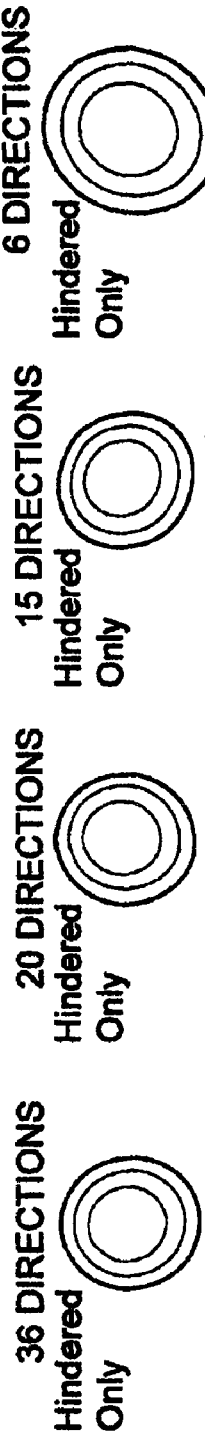
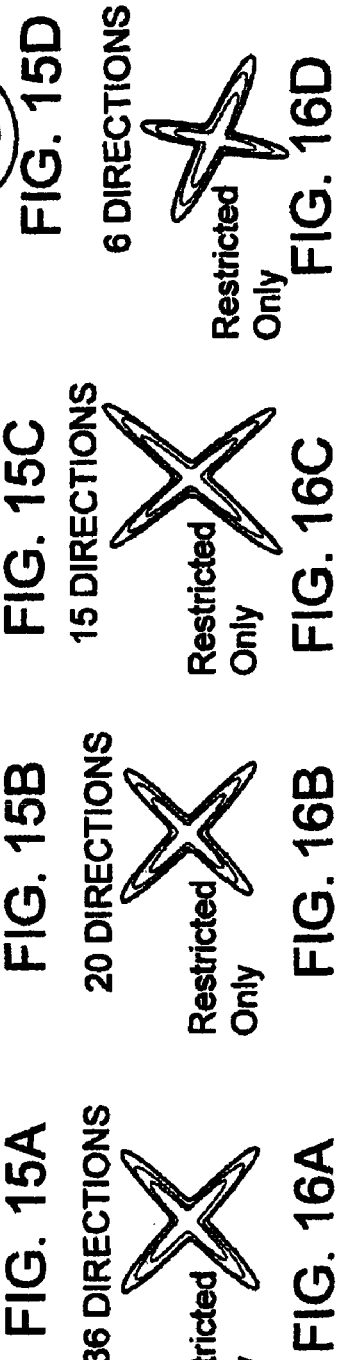
FIG. 14A  FIG. 14B  FIG. 14C  FIG. 14D
FIG. 15A  FIG. 15B  FIG. 15C  FIG. 15D
FIG. 16A  FIG. 16B  FIG. 16C  FIG. 16D
FIG. 17A  FIG. 17B  FIG. 17C

FIG. 18A 36 DIRECTIONS Combined
FIG. 18B 20 DIRECTIONS Combined
FIG. 18C 15 DIRECTIONS Combined
FIG. 18D 6 DIRECTIONS Combined

FIG. 19A 36 DIRECTIONS Hindered Only
FIG. 19B 20 DIRECTIONS Hindered Only
FIG. 19C 15 DIRECTIONS Hindered Only
FIG. 19D 6 DIRECTIONS Hindered Only

FIG. 20A 36 DIRECTIONS Restricted Only
FIG. 20B 20 DIRECTIONS Restricted Only
FIG. 20C 15 DIRECTIONS Restricted Only
FIG. 20D 6 DIRECTIONS Restricted Only NF 0.03 Combined NF 0.06 Combined NF 0.09 Combined NF 0.12 Combined NF 0.03 Hindered Only NF 0.06 Hindered Only NF 0.09 Hindered Only NF 0.12 Hindered Only NF 0.03 Restricted Only NF 0.06 Restricted Only NF 0.09 Restricted Only NF 0.12 Restricted Only

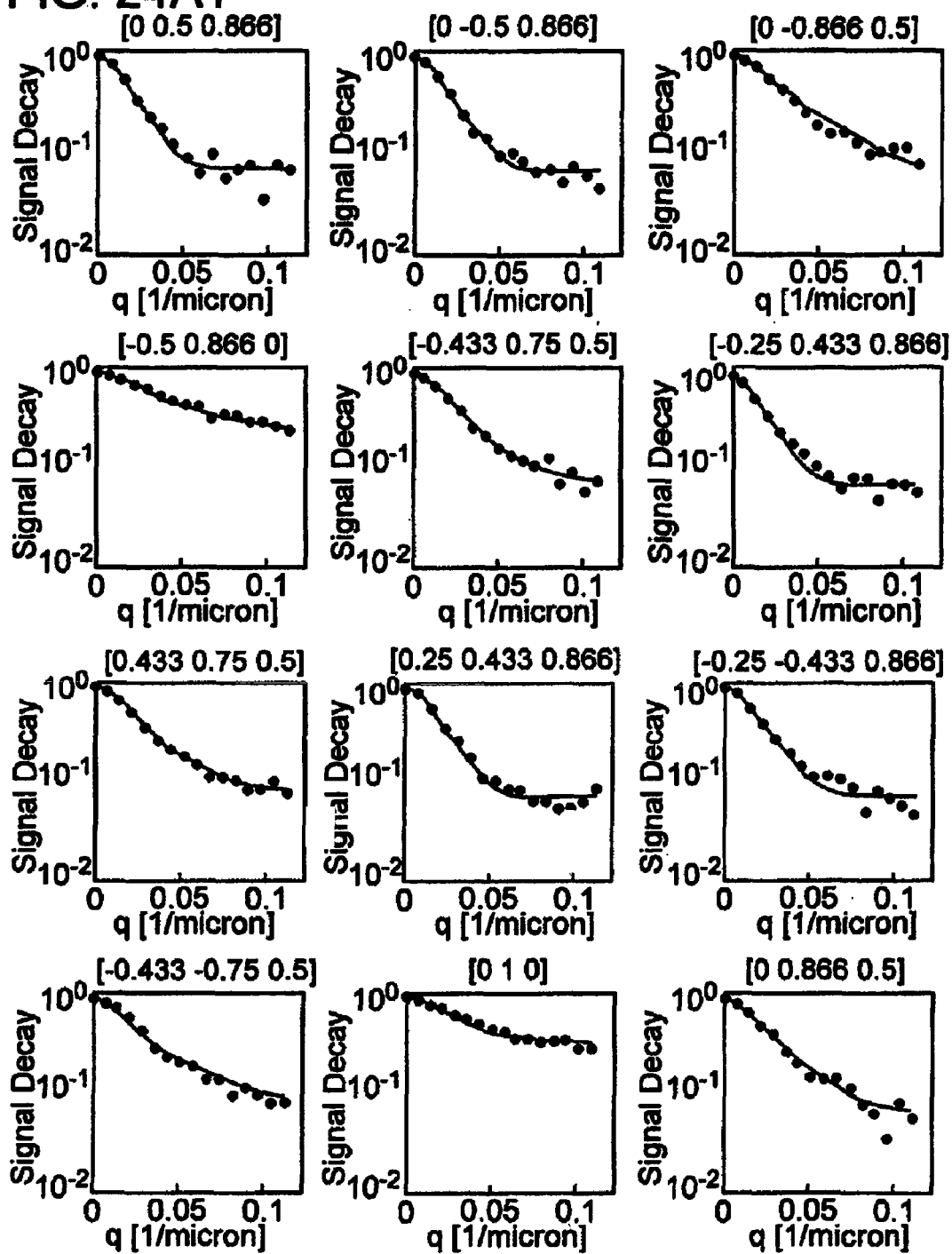
FIG. 24A1

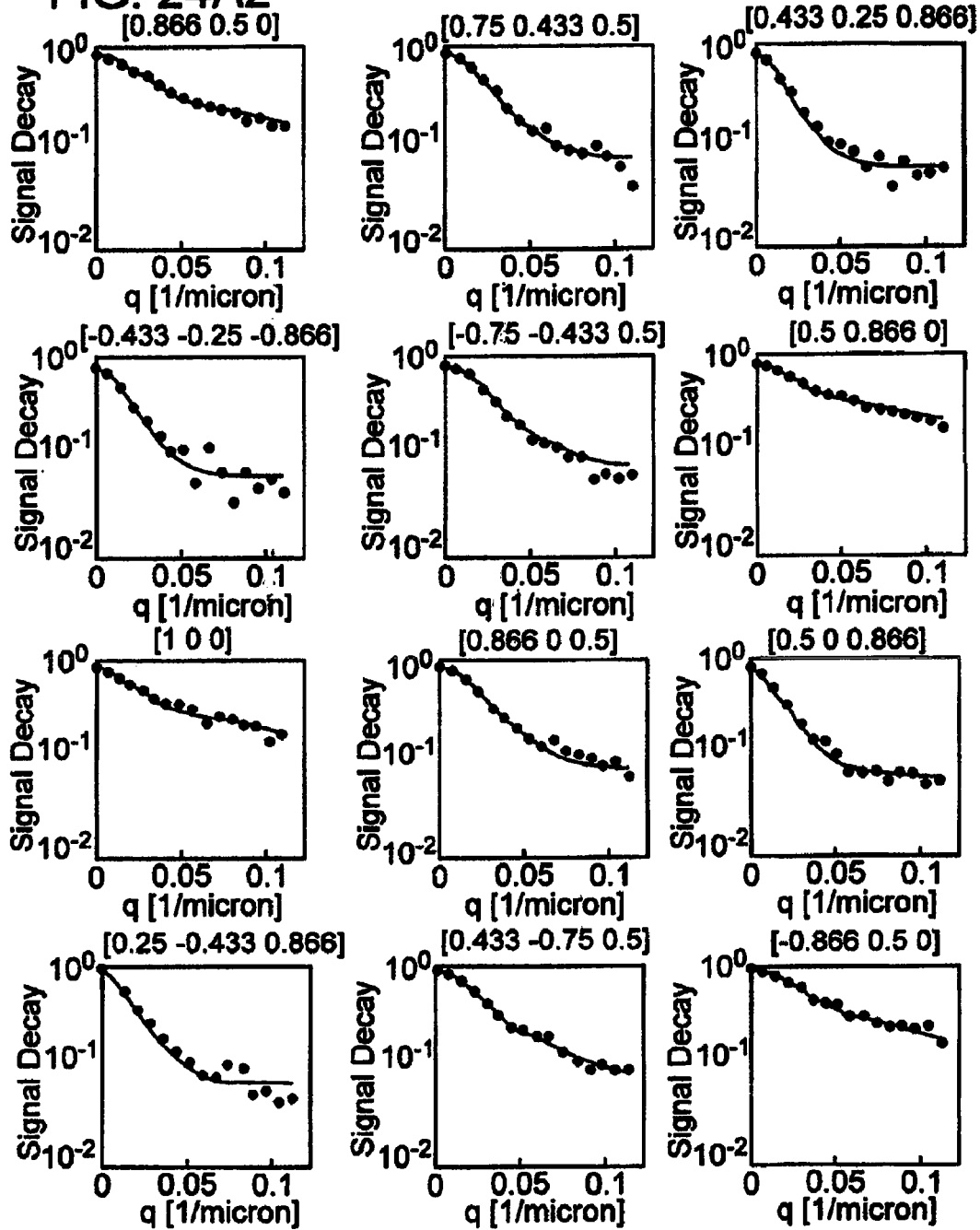
FIG. 24A2

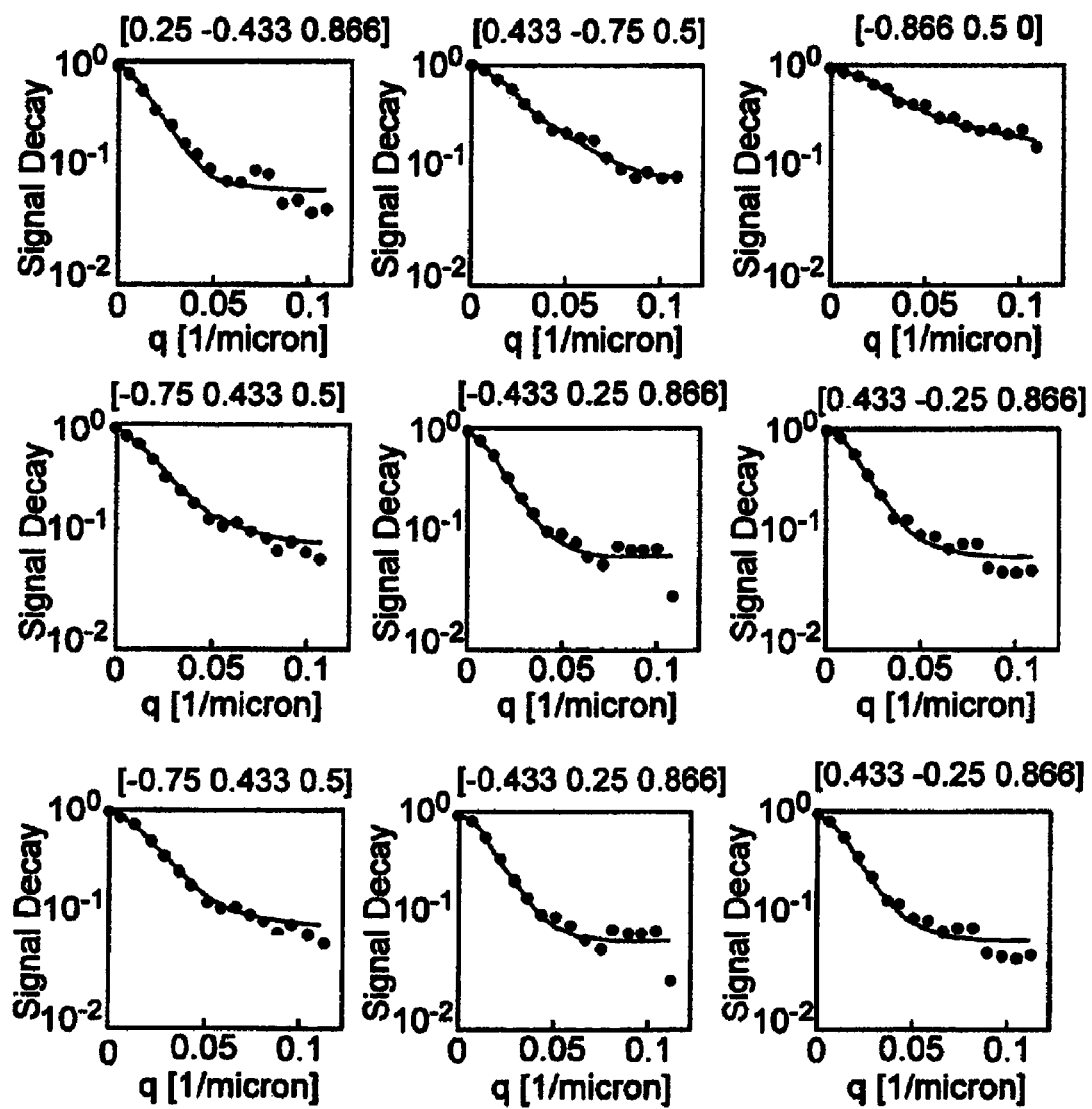
FIG. 24A3

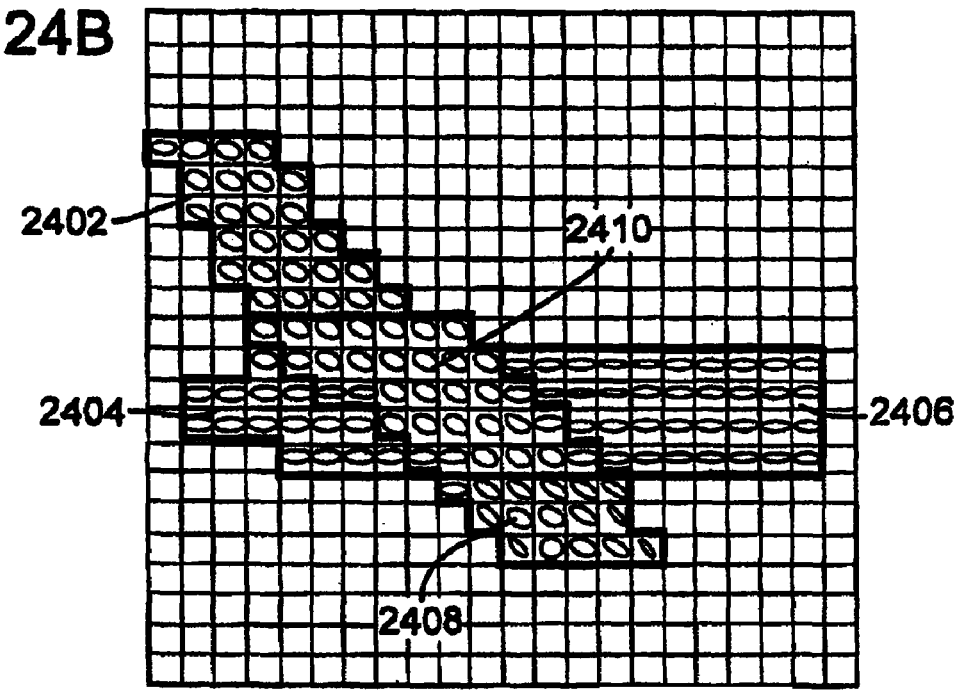
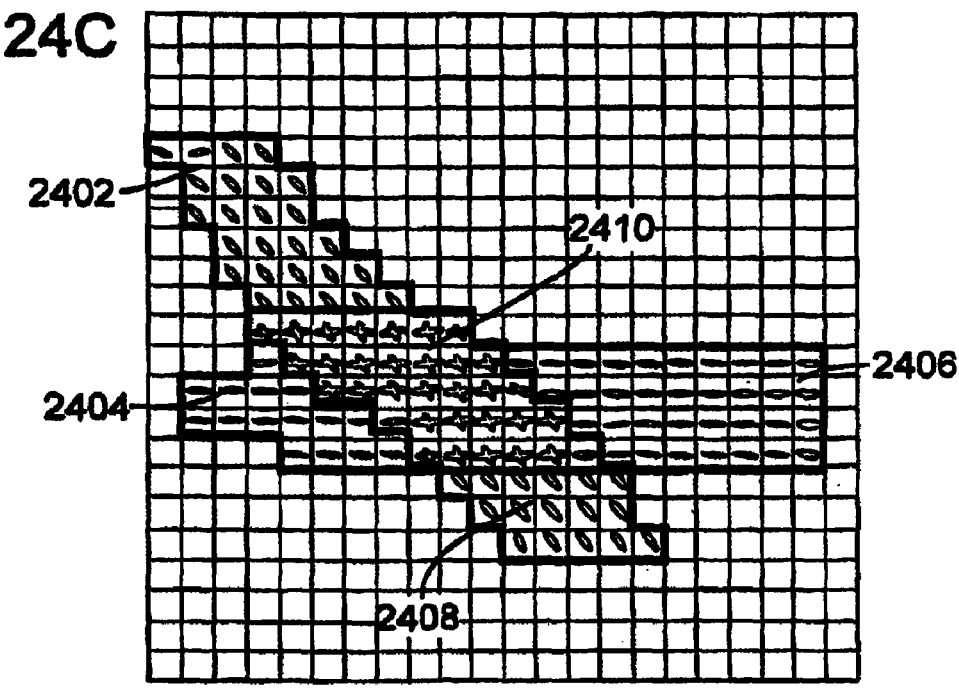

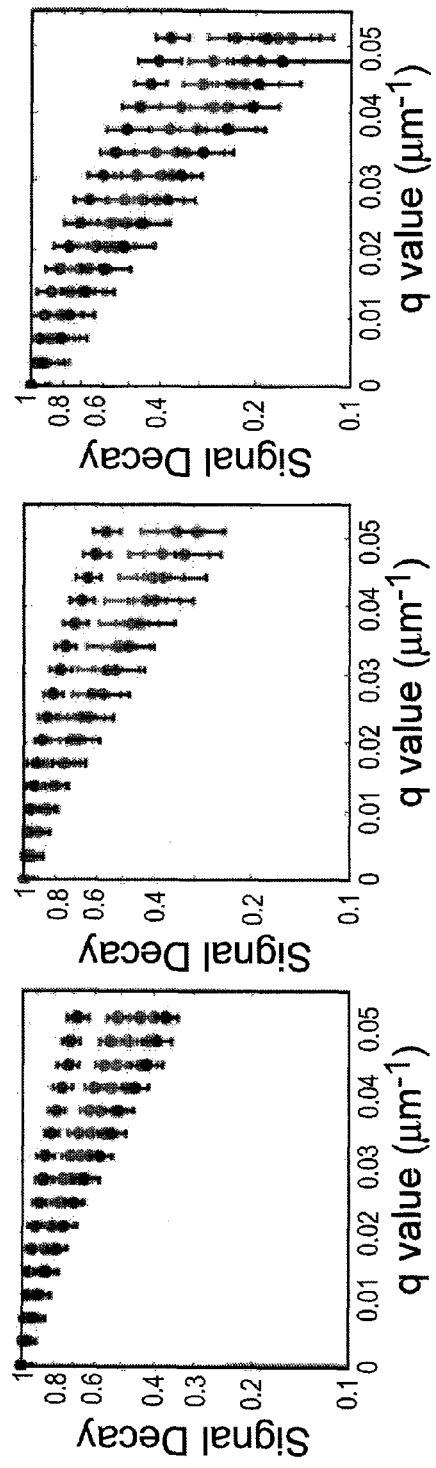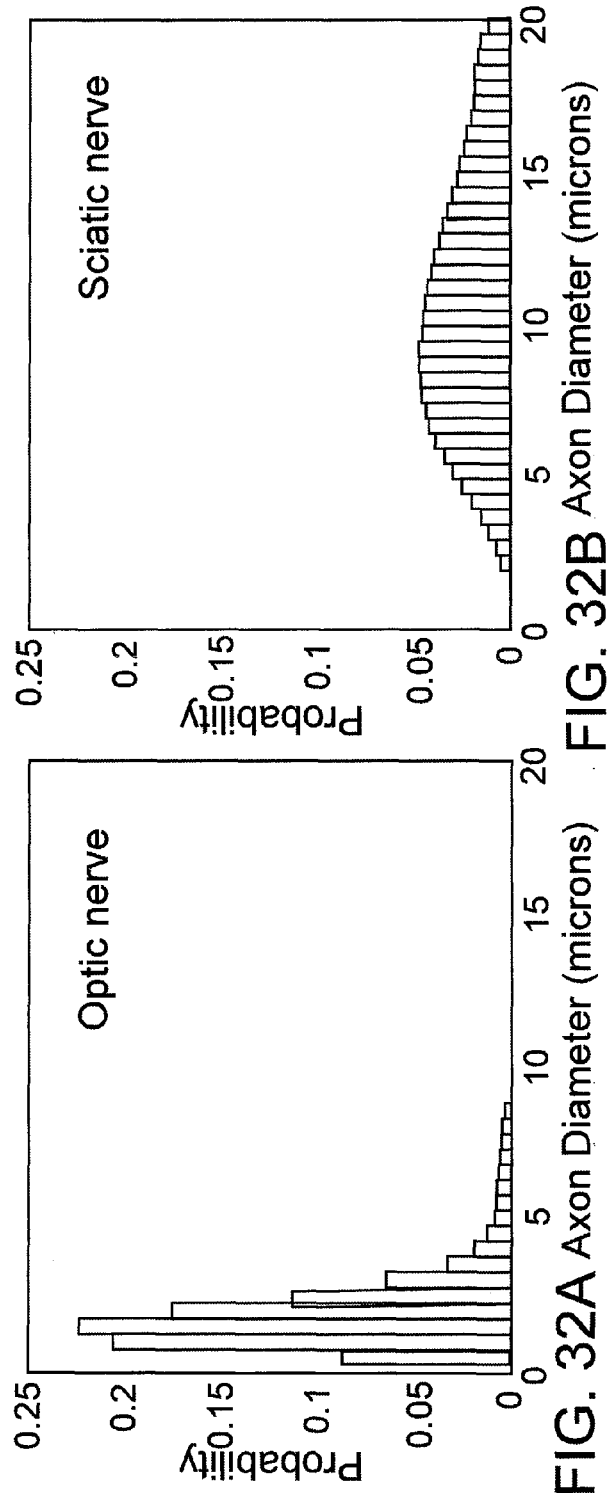

NON-INVASIVE IN VIVO MRI AXON DIAMETER MEASUREMENT METHODS

CROSS-REFERENCE TO RELATED APPLICATIONS

This application is a continuation-in-part of U.S. patent application Ser. No. 10/888,917, filed Jul. 8, 2004 now U.S. Pat No. 7,643,863 which claims the benefit of U.S. Provisional Patent Application 60/485,658, filed Jul. 8, 2003, and U.S. Provisional Patent Application 60/571,064, filed May 14, 2004, all of which are incorporated herein by reference.

STATEMENT OF GOVERNMENT RIGHTS

This invention was made with government support under a contract awarded by the Department of Health and Human Services, National Institutes of Health. The government has certain rights in the invention.

TECHNICAL FIELD

The invention pertains to magnetic resonance methods and apparatus.

BACKGROUND

Magnetic resonance imaging (MRI) has been used with a variety of specimens in clinical and other applications. In many examples, images are based on differences in the so-called $T_1$ and $T_2$ relaxation times in the specimen being imaged. In other examples, translational diffusion can be used as a relaxation mechanism that produces image contrast. While in some specimens, translational diffusion of spins is isotropic, in many important applications, specimens exhibit structural features that make translational diffusion anisotropic. To evaluate diffusion anisotropies of a specimen, so-called diffusion tensor (DT) methods such as those described in Basser et al., U.S. Pat. No. 5,539,310, can be used. These methods typically involve the application of pulsed-gradient magnetic field sequences in a multiplicity of directions. DT methods are generally based on 3-dimensional Gaussian spin-displacement profiles appropriate at small q-values, wherein q is proportional to a magnitude and a duration of an applied pulsed magnetic-field gradient ("PFG") MR sequences. DT methods can fail to reveal important specimen properties when the 3-dimensional Gaussian displacement model is not applicable, and improved MR methods and apparatus are needed.

SUMMARY

The MR methods described herein comprise obtaining a set of translational diffusion-weighted MR signals associated with a plurality of magnetic field gradient strengths and a plurality of magnetic field gradient directions. At least one parameter associated with translational diffusion in a restricted compartment and at least one parameter associated with translational diffusion in a hindered compartment are estimated based on the set of signals. In a representative example, the set of signals is a set of image signals. In additional examples, the estimated parameter associated with the restricted compartment corresponds to an orientation of the restricted compartment, a spin fraction associated with the restricted compartment, a dimension of the restricted compartment, or a diffusivity associated with the restricted compartment. In further examples, at least a second parameter associated with translational spin diffusion in a second restricted compartment is estimated. In additional examples, the estimated parameter associated with the hindered compartment is a spin fraction associated with the hindered compartment. In other examples, such methods include identifying signal portions of the set of signals with translational diffusion in the restricted compartment and translational diffusion in a hindered compartment. For applications in the Peripheral Nervous System (PNS) and Central Nervous System (CNS) signal portions corresponding to diffusion in the restricted compartment are associated with diffusion in an intra-axonal volume, and signal portions corresponding to translational diffusion in the hindered diffusion compartment are associated with diffusion in an extra-axonal volume. Hindered and restricted compartments can be similarly identified and characterized in other specimens such as skeletal, smooth and cardiac muscle.

Methods of analyzing a nerve fiber comprise obtaining an estimate of a spin fraction associated with restricted translational diffusion, and comparing the estimate of spin fraction with a control value of spin fraction. A normalized diffusion weighted signal is generally obtained as a ratio of a diffusion weighted signal to a signal obtained without diffusion weighting. For nerve fiber analysis, a normalized or unnormalized signal can be compared with a corresponding signal associated with a reference nerve fiber that can be a normal nerve fiber, or a diseased or damaged nerve fiber. Other specimens are typically evaluated in a similar manner. In some examples, the control value is a previous estimate of spin fraction associated with restricted diffusion. In additional examples, a series of estimates of spin fraction associated with restricted diffusion are obtained, and compared with corresponding control values. In other examples, an estimate of an orientation of a specimen portion associated with restricted diffusion is obtained.

MR apparatus comprise a pulsed-gradient field controller configured to apply pulsed gradient fields having a plurality of magnitudes in a plurality of directions. A signal generator is configured to apply a plurality of MR signals to excite spins in a portion of a specimen. A signal detector is configured to receive and record a plurality of MR signals associated with the applied PFGs and the applied MR signals. A processor is configured to estimate at least one parameter associated with translational diffusion in a compartment exhibiting restricted translational diffusion and at least one parameter associated with translational diffusion in a compartment exhibiting hindered diffusion based on the recorded MR signals. In some examples, a display is configured to exhibit a diffusion distance associated with translational diffusion in the restricted compartment and in the hindered compartment. In other examples, the processor is configured to estimate an orientation of the restricted compartment based on the recorded MR signals. In further examples, the processor is configured to estimate at least one diffusivity associated with the restricted compartment and with the hindered compartment.

Methods of tracking an orientation of a nerve fiber, a nerve fiber bundle, or other fibers comprise obtaining a set of diffusion-weighted MR signals associated with the fiber, and estimating a fiber orientation based on portions of the MR signals associated with restricted translational diffusion associated with the fiber. In other examples, an orientation of a second fiber is estimated based on portions of the MR signals associated with restricted translational diffusion associated with the second fiber.

At least one computer readable medium has stored thereon computer-executable instructions for a method that comprises obtaining a set of recorded translational diffusion-weighted magnetic resonance signals associated with a plurality of diffusion times. The method further comprises generating an initial estimate of a distribution of at least one parameter associated with translational diffusion in restricted compartments of a sample associated with the set of signals. Based on the initial estimate, a final estimate of the distribution of the at least one parameter is generated and communicated via a display or network. In some examples, the method comprises providing the initial estimate based on a parametric distribution function. In other examples, the method further comprises providing the final estimate non-parametrically. In some examples, the set of signals is a set of image signals, and the distribution is associated with a selected pixel or set of pixels in the image signals. In some examples, the estimated parameter associated with the restricted compartments corresponds to an orientation of the restricted compartments or a spin fraction confined in the restricted compartments.

Computer-implemented methods of analyzing nerve fibers comprise obtaining a non-parametric estimate of a distribution of a nerve fiber parameter based on a plurality of diffusion weighted magnetic resonance signals and comparing the estimated distribution with a reference distribution. Based on the comparison, an assessment of the nerve fibers is provided. In some examples, the nerve fiber parameter is selected from the group consisting of nerve fiber orientation and nerve fiber diameter. In some examples, the estimated distribution is obtained based on an initial distribution estimate and the initial estimate is based on a distribution function.

Magnetic resonance apparatus comprise a pulsed-gradient field controller configured to apply pulsed-gradient fields having a plurality of magnitudes in a plurality of directions and a signal detector configured to receive and record a plurality of magnetic resonance signals associated with the applied pulsed-gradient fields. A processor is configured to produce an initial estimate of a distribution of at least one parameter associated with translational diffusion in compartments of a specimen exhibiting restricted translational diffusion based on the recorded magnetic resonance signals, and produce a final estimate based on the initial estimate. In some examples, the processor is configured to produce the initial estimate based on a parametric distribution function. In further examples, the processor is configured to provide the final estimate non-parametrically from the initial distribution.

These and other features and advantages are set forth below with reference to the accompanying drawings.

BRIEF DESCRIPTION OF THE DRAWINGS

FIGS. 6A-6F are respective graphs of relative MR signal strengths obtained from rat sciatic nerve as a function of a magnitude of q for gradient fields applied in different directions. Measurements are indicated as data points and modeled signal strengths are shown as continuous curves. Model parameters for modeled signal strengths are f=0.3, $D_{//}=1.18\times10^{-5}$ cm$^2$/s, $\lambda_{//}=1.1\times10^{-5}$ cm$^2$/s, $\lambda_{\perp}=0.45\times10^{-5}$ cm$^2$/s, $\theta=3°$, and $\phi=50°$.

FIGS. 11A-11D illustrate surfaces showing diffusion distances as a function of direction based on simulations of signals based on a single fiber orientation using PFG MR sequences in 36, 20, 15, and 6 directions, respectively.

FIGS. 12A-12D and FIGS. 13A-13D illustrate surfaces showing diffusion distances as a function of direction based on simulations using PFG MR sequences in 36, 20, 15, and 6 directions, respectively, for a hindered-diffusion component and a restricted-diffusion component, respectively, based on the simulated signals associated with FIGS. 11A-11D.

FIGS. 14A-14D illustrate surfaces showing diffusion distances as a function of direction based on application of PFG MR sequences in 36, 20, 15, and 6 directions, respectively, to two fibers arranged at 90 degrees relative to each other.

FIGS. 15A-15D and 16A-16D illustrate surfaces showing diffusion distances as a function of direction based on application of PFG MR sequences in 36, 20, 15, and 6 directions, respectively, for the hindered-diffusion component and the restricted-diffusion component, respectively, based on the simulated signals associated with FIGS. 14A-14D.

FIGS. 17A-17C illustrate surfaces showing diffusion distances as a function of direction based on application of PFG MR sequences in 36, 20, 15, and 6 directions, respectively, obtained without reference to a restricted-diffusion component.

FIGS. 18A-18D illustrate surfaces showing diffusion distances as a function of direction based on application of PFGs in 36, 20, 15, and 6 directions, respectively, for fibers arranged at an angle of 15 degrees relative to each other.

FIGS. 19A-19D and FIGS. 20A-20D illustrate surfaces showing diffusion distances as a function of direction based on application of PFG MR sequences in 36, 20, 15, and 6 directions, respectively, for the hindered-diffusion component and the restricted-diffusion component, respectively, associated with the simulated signals used in FIGS. 18A-18D.

FIGS. 24A1-24A3 illustrate experimental data and single-fiber (one restricted compartment and one hindered compartment) data fits for a selected pixel associated with an area of homogeneous white matter of a pig spinal cord for PFG MR sequences applied in a plurality of directions.

FIG. 24B depicts displacement iso-probability plots calculated for pixels in a pig spinal cord sample arranged as in FIG. 10B. Experimental data for low b-values are fit based on a single hindered compartment using conventional diffusion tensor model used in diffusion tensor imaging.

FIG. 24C depicts displacement iso-probability plots calculated for pixels in a pig spinal cord sample arranged as in FIG. 10B, wherein the plots correspond to the iso-probability plots of FIG. 24B. For pixels associated with one fiber population, the probability plots were based on both low and high b-values using a model having one hindered and one restricted compartment. For pixels associated with crossing fibers, the probability plots were based on both low and high b-values using a model having one hindered and two restricted compartments.

FIGS. 31A-31C are graphs of signal decay as a function of q for several values of diffusion time ranging from 10 ms to 150 ms for the pig spinal cord regions 1-3 shown in FIGS. 30B-30F.

FIGS. 32A-32B are non-parametric histograms of axon diameter distributions for pig optic nerve and pig sciatic nerve, respectively.

FIG. 33A corresponds to a portion of the genu, FIGS. 33B-33C correspond to portions of the body, and FIGS. 33D-33E correspond to portion of the splenium.

DETAILED DESCRIPTION

Figure 1:
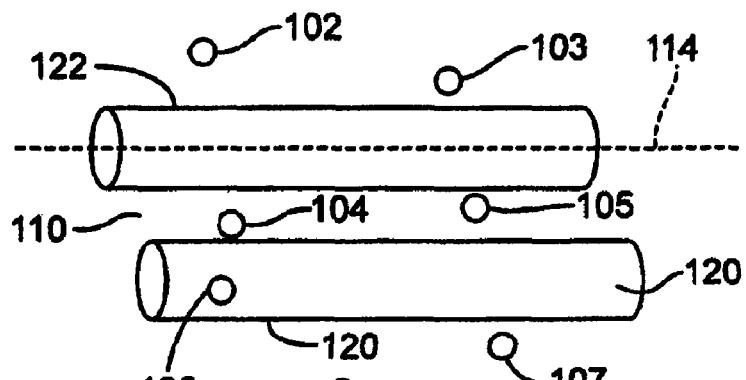
FIG. 1 is a schematic diagram illustrating diffusion of water molecules in an intra-axonal space and an extra-axonal space.

Magnetic resonance imaging (MRI) systems can be configured to produce diffusion-weighted images. Translational diffusion anisotropy of protons in water or another spin-labeled species can be spatially varying, and specimen properties can vary as functions of one or more spatial coordinates. Such magnetic resonance (MR) analysis of anisotropic specimens can be used in many practical examples. For example, MR images of specimens exhibiting anisotropic translational diffusion such as brain white matter can be used in the diagnosis and therapy of a variety of disorders as well as the assessment of normal and abnormal brain development, degeneration, and aging. For convenience, MR methods and apparatus are discussed herein with reference to specimens such as brain white matter and other specific specimens, but such methods can be applied to other specimens that exhibit isotropic or anisotropic translational diffusion. A selected portion or portions of a specimen can be evaluated using MR techniques, or a plurality of locations can be evaluated and an associated image assembled. For convenience in the following description, evaluation of one or a few specimen portions is described. These portions can correspond to volume elements (voxels) of an MR image.

MR images are generally based on detection of a magnitude, phase, orientation, or other property of spins of one or more sample constituents. In some examples, a spatially varying magnetic field such as a pulsed-gradient magnetic field is applied to a specimen to produce a spatial variation in spin angular frequency, which results in a spatial variation in the phase of these spins. For convenience, spin encodings that make MR signals sensitive to net spin displacements are referred to as herein as diffusion-weighted spins, and such encodings are referred to as diffusion encodings. Diffusion-weighted MR signals and images are based on such diffusion-weighted spins. MR signals can be obtained that can be associated with isotropic or anisotropic translational diffusion. Such signals are referred to herein as "diffusion-weighted signals" and images based on such signals are referred to as "diffusion-weighted images." Methods of obtaining such signals are described in, for example, Le Bihan, U.S. Pat. No. 4,809,701 and Basser, U.S. Pat. No. 5,539,310, that are incorporated herein by reference. In the following description, vector and tensor quantities are written in boldface.

Brain white matter is a representative anisotropic specimen. Brain white matter occupies a substantial fraction of brain volume, and is composed of ordered fascicles whose axons are surrounded by a complex extra-axonal environment containing astrocytes, glia, and extracellular matrix. Nerve fibers (bundles of axons) are structurally anisotropic as a function of position due to the extension of the axons along a local axis. Some axons have associated myelin sheaths, but small-diameter axons are typically not myelinated. The orientation of this local axis typically varies throughout a specimen, but in other anisotropic specimens a local axis or other anisotropy can be constant throughout the specimen. White matter can be locally anisotropic with respect to a local axonal axis, and MR signals obtained from white-matter specimens can reflect this anisotropy. In some specimens, axons are not locally aligned with respect to a single axis. Diffusion-weighted MR signals can be associated with spin diffusion parallel to and perpendicular to a local axonal axis (or a distribution of local axes) in intra-axonal volumes and/or extra-axonal volumes. Diffusion of spin-labeled species such as water molecules can be associated with so-called "hindered" diffusion in an extra-axonal space, and "restricted" diffusion in an intra-axonal space. As used herein, "hindered" diffusion typically refers to tortuous diffusion around diffusion barriers but without confinement to a particular volume, and "restricted" diffusion typically refers to diffusion confined to a volume defined by surrounding diffusion barriers. MR signals can include contributions associated with restricted diffusion in the extra-axonal space as well, and such contributions can be analyzed in addition to the MR signal contributions associated with intra-axonal restricted diffusion. The extra-axonal contributions are generally small, and are not further described.

With reference to FIG. 1, representative water molecules 102-107 or other spin species are situated in an extra-axonal space 110 surrounding representative axons 120, 122 and exhibit anisotropic diffusion. The extra-axonal space 110 typically can contain extracellular matrix, proteins, oriented filaments, and glial cells such as astrocytes. For convenience, the axons 120, 122 are represented as cylinders. Diffusion in a direction parallel to a local axonal axis 114 is relatively unimpeded by the presence of the axons 120, 122, while diffusion in a direction perpendicular to the local axonal axis 114 is impeded by the axons 120, 122. Diffusion in the extra-axonal space 110 is referred to as "hindered." A water molecule 130 or other spins situated in an intra-axonal space of the axon 120 diffuses relatively freely in a direction parallel to the local axonal axis 114 but diffusion is impeded in a perpendicular direction because the water molecule 130 is confined within the axon 120. Diffusion in the intra-axonal space perpendicular to the fiber axis is referred to herein as "restricted." In some examples, spins are confined, and a diffusion distance is limited to a distance associated with a dimension of a so-called "restricted compartment." In other examples, spins in a restricted compartment can diffuse out of the compartment, while in other examples, spins remain substantially confined during any practical measurement interval. Spins exterior to a restricted compartment can also diffuse into the restricted compartment. Typically, diffusion in a restricted volume or along a restricted direction is associated with a diffusion distance that initially increases linearly as a function of a square root of diffusion time but then appears to saturate. In contrast, unrestricted diffusion is generally associated with a diffusion distance that continues to increase as a function of diffusion time without saturating. In some examples, such a diffusion distance increases linearly as a function of the square root of the diffusion time. Axons are represented as cylinders in FIG. 1 so that the axon interior and exterior extend along a common axis, but in other examples, the axon interior and exterior extend along different axes. In addition, the representative axons 120, 122 are shown as having a common diameter, but specimens can have axons of different diameters, and spins can be confined within volumes having elliptical or other cross-sections.

MR signals associated with diffusion can be produced using a pulsed field gradient (PFG) sequence that is typically used in so-called q-space MRI, but other pulse sequences can be used. In q-space MRI, a sample portion is situated in a static magnetic field, typically for a duration long enough to permit some or all spins of one or more species in the sample portion to align with the static magnetic field. A radiofrequency (RF) pulse generator is configured to produce an RF pulse (a so-called π/2-pulse) so that specimen spins are rotated into a plane perpendicular to the static magnetic field. A gradient pulse described by a gradient-pulse waveform G(t) associated with a magnetic field gradient $G_0$ having an effective pulse duration δ is applied to produce a spin wavenumber of $q=(1/2\pi)\gamma G_0 \delta$, wherein γ is a gyromagnetic ratio and q is the magnitude of q. In some examples, the duration δ is sufficiently short so that spin displacements during the application of the gradient-pulse waveform G(t) are small compared to spin displacements that occur during a diffusion time Δ after which spin diffusion is measured, and spin diffusion during the gradient-pulse duration δ can be neglected. The magnetic field produced by application of the gradient-pulse waveform G(t) is a function of spatial coordinates, and application of the gradient pulse produces a spatially encoded spin distribution. During the diffusion time Δ, the spin-labeled species move (by, for example, diffusion) and the spatially encoded spin distribution changes. Another RF pulse (a so-called π-pulse) is applied followed by a reapplication of the PFG. The combination of the π-pulse and the PFG tends to reverse the spatial encoding of stationary spins, but does not reverse changes in the spatial spin distribution associated with diffusion or other spin displacements. Therefore, the MR signal obtained after application of this sequence can be associated with spin diffusion or other spin displacements in the specimen. Many other MR pulse sequences can be used, and other examples are described in, for example, P. Callaghan, *Principles of Nuclear Magnetic Resonance Microscopy* (Oxford University Press, 1991). In some examples, described in, for example, R. Kimmich, *NMR: Tomography, Diffusometry, Relaxometry* (Springer Verlag 1997), a diffusion sequence or "diffusion filter" can be applied before the imaging sequence.

If translational spin diffusion produces a 3-dimensional Gaussian displacement distribution and δ<<Δ, then an MR signal produced using the PGF sequence can be expressed as:

$$|E(q)|=\exp(-4\pi^2 q^T Dq\Delta),$$

wherein D is a diffusion tensor, and $q^T$ is the transpose of q, i.e., $q^T$ is a row vector corresponding to the column vector q. By application of a series of gradient pulses in different directions, estimates of the values of the elements of the tensor D can be obtained. Depending on magnitudes of the pulse-gradient duration δ and the diffusion time Δ, an effective diffusion time $\Delta_{eff}=\Delta-\delta/3$ can be used in the above expression instead of the diffusion time Δ. A similar expression can be obtained for MR signals in isotropic specimens. In some examples, expressions for MR signals can be expressed in terms of a so-called "b-value," wherein b is proportional to a product of $(\gamma G_0 \delta)^2$ and the effective diffusion time.

Modeling Overview

MRI evaluation of anisotropic specimens can be based on modeling of translational diffusion of spins. Spins in anisotropic specimens typically can be associated with either a hindered compartment in which spins diffuse in three dimensions without substantial impairment or to a restricted compartment in which spin diffusion is confined in at least one direction due to specimen structure. An MR signal can be decomposed into signal portions associated with a hindered spin fraction and a signal portion associated with a restricted spin fraction. The signal portion associated with the hindered spin fraction typically exhibits Gaussian diffusion decay while the signal portion associated with the restricted spin fraction exhibits non-Gaussian decay. In the restricted compartment, diffusion along one or more axes can be assumed to be uncorrelated so that diffusion along these axes can be modeled independently. In some examples, diffusion in a restricted compartment can be modeled along some directions as hindered diffusion and associated with a Gaussian diffusion decay. For example, for spins confined within a cylindrical volume, diffusion along a cylinder axis can be modeled as hindered, while diffusion perpendicular to the cylinder axis is restricted and exhibits non-Gaussian diffusion decay. In some cases, the restricted compartments can be represented as an ensemble of different, similar, or identical dimensions but with different orientations. This modeling framework can also reflect exchange of spins between the restricted compartment and the hindered compartment, a variety of diffusion models can be selected for modeling of the compartments based on, for example, MR signal-acquisition characteristics. This modeling framework can be referred to as a "composite hindered and restricted model of diffusion" (CHARMED). Application of this modeling framework to brain white matter is described below as a representative but significant example.

Modeling of Magnetic Resonance Signals in Brain White Matter

MR signals associated with brain white matter generally decrease mono-exponentially as a function of q for small values of q (small b-values), which is indicative of a 3-D Gaussian displacement distribution. For large q-values (large b-values), observed decay is not mono-exponential, and a residual signal may persist above the noise floor (NF). Based on the above expression for Gaussian decay, observed signal decay is expected to be mono-exponential for all values of q (or b), and the conventional diffusion-tensor approach is inadequate to describe such observed signals and to permit assessment of sample properties associated with such signals. MR signals such as those associated with diffusion imaging of brain white matter can be modeled as described below consistently with observed signals. Based on such consistent modeling, specimen characteristics associated with observed signals can be estimated.

An MR signal $E(q,\Delta)$ associated with brain white matter can be expressed as a weighted sum of contributions $E_h(q,\Delta)$ and $E_r(q,\Delta)$, associated with spins that exhibit hindered diffusion and restricted diffusion, respectively:

$$E(q,\Delta) = f_h \cdot E_h(q,\Delta) + f_r \cdot E_r(q,\Delta), \qquad [1]$$

wherein $f_h$ is a fraction of specimen spins associated with hindered diffusion, $f_r$ is a fraction of specimen spins associated with restricted diffusion, and the subscripts h, r refer to hindered and restricted specimen fractions, respectively. The fractions $f_h$ and $f_r$ are typically $T_1$-weighted volume fractions. The values of $T_1$ for the restricted and hindered components need not be equal. In many specimens, the restricted fraction is substantially confined, and there is limited exchange between spins in the restricted and the hindered fraction. In such specimens, exchange between the restricted and hindered spins is referred to as "slow," and a "slow exchange" limit can be used to assess signal attenuation. In other examples, exchange between the restricted and hindered fractions can be included. Typical time constants associated with intracellular and intraaxonal exchange are about 10-25 ms and 400-700 ms, respectively.

A corresponding fast-exchange limit can be written as a volume-fraction-weighted expression as follows:

$$E(q,\Delta) = E_h(q,\Delta)^{f_h} \times E_r(q,\Delta)^{f_r}.$$

Intra-Axonal (Restricted) Diffusion

The MR signal $E_r(q,\Delta)$ associated with intra-axonal (restricted) diffusion can be expressed as a combination of signal contributions $E_{//}(q,\Delta)$ and $E_\perp(q,\Delta)$ associated with spin diffusion parallel to and perpendicular to the local axonal axis, respectively. The perpendicular component contribution $E_\perp(q,\Delta)$ can be modeled based on, for example, diffusion in impermeable cylinders as described in P. T. Callaghan, "Pulsed Gradient Spin Echo NMR for Planar, Cylindrical and Spherical Pores Under Condition of Wall Relaxation," J. Magn. Reson. A113:53-59 (1995). The parallel-component contribution $E_{//}(q,\Delta)$ can be modeled as free or hindered 1-dimensional diffusion described by a Gaussian displacement distribution. These contributions can be decoupled as shown below.

The measured MR signal $E_r(q,\Delta)$ associated with restricted diffusion can be expressed as:

$$E_r(q,\Delta) = \int \overline{P}_s(R,\Delta) \exp(i2\pi q \cdot R) dR,$$

wherein $\overline{P}_s(R, \Delta)$ is a spin-displacement propagator associated with a number density of spins having a displacement R at a diffusion time $\Delta$.

For diffusion associated with an intra-axonal volume, displacements parallel and perpendicular to the local axonal axis are statistically independent:

$$\overline{P}_s(R,\Delta) = \overline{P}_\perp(R_\perp,\Delta) \overline{P}_{//}(R_{//},\Delta),$$

wherein $P_\perp$ and $P_{//}$ are spin displacement distributions associated with displacements perpendicular to and parallel to the local axonal axis, respectively. The displacement R can be expressed as a sum of displacement components $R_{//}$ and $R_\perp$, which are parallel and perpendicular to the local axonal axis, respectively, with $R = R_{//} + R_\perp$. The MR signal $E_r(q,\Delta)$ associated with restricted diffusion can then be expressed as:

$$E_r(q,\Delta) = \iiint \overline{P}_\perp(R_\perp,\Delta) \overline{P}_{//}(R_{//},\Delta) \exp(i2\pi q \cdot (R_\perp + R_{//})) dR_\perp dR_{//}$$

The exponential functions associated with the parallel displacement $R_{//}$ and the perpendicular displacement $R_\perp$ can also be separated:

$$E_r(q,\Delta) = \iiint \overline{P}_\perp(R_\perp,\Delta) \exp(i2\pi q \cdot R_\perp) dR_\perp \overline{P}_{//}(R_{//},\Delta) \exp(i2\pi q \cdot R_{//}) dR_{//},$$

and the integrals can be separated as follows:

$$E_r(q,\Delta) = \int \overline{P}_\perp(R_\perp,\Delta) \exp(i2\pi q \cdot R_\perp) dR_\perp \int \overline{P}_{//}(R_{//},\Delta) \exp(i2\pi q \cdot R_{//}) dR_{//}.$$

The vector q can also be expressed as a vector sum of components $q_{//}$ and $q_\perp$ that are parallel and perpendicular to the local axonal axis with $q = q_{//} + q_\perp$. Thus, $$E_r(q,\Delta) = \int \int \overline{P}_\perp(R_\perp, \Delta) \exp(i2\pi(q_{//} + q_\perp) \cdot R_\perp) dR_\perp \cdot \int \overline{P}_{//}(R_{//}, \Delta) \exp(i2\pi(q_{//} + q_\perp) \cdot R_{//}) dR_{//}$$

Because the dot products $q_{//} \cdot R_\perp = q_\perp \cdot R_{//} = 0$, the MR signal $E_r(q,\Delta)$ can be written as:

$$E_r(q,\Delta) = \int \overline{P}_\perp(R_\perp,\Delta) \exp(i2\pi q_\perp \cdot R_\perp) dR_\perp \int \overline{P}_{//}(R_{//},\Delta) \exp(i2\pi q_{//} \cdot R_{//}) dR_{//}.$$

For convenience, $E_\perp(q_\perp)$ and $E_{//}(q_{//})$ are defined as follows:

$$E_\perp(q_\perp) = \int \overline{P}_\perp(R_\perp,\Delta) \exp(i2\pi q_\perp \cdot R_\perp) dR_\perp, \text{ and}$$

$$E_{//}(q_{//}) = \int \overline{P}_{//}(R_{//},\Delta) \exp(i2\pi q_{//} \cdot R_{//}) dR_{//}.$$

Therefore, the MR signal $E_r(q,\Delta)$ can be expressed as $$E_r(q,\Delta) = E_\perp(q_\perp,\Delta) E_{//}(q_{//},\Delta).$$

Thus, statistical independence of displacements parallel and perpendicular to a local axonal axis implies that the net MR signal $E_r(q,\Delta)$ can be expressed as a product of signals associated with diffusion parallel and perpendicular to the local axonal axis. Similar decompositions can be provided for other geometries. For example, a restricted volume situated between planar barriers can be associated with diffusion components parallel to the planar barriers and perpendicular to the planar barriers. In other examples, the restricted volume has a rectangular, square, or elliptical cross-section and signal contributions can be similarly analyzed. There can be a subset of spins that are close to a wall and can undergo effective 2-D diffusion predominantly parallel to the surface of the wall.

Modeling of $E_{//}(q_{//},\Delta)$ and $E_{\perp}(q_{\perp}\Delta)$

Diffusion parallel to the local axonal axis within the axon can be modeled as free diffusion associated with a Gaussian displacement distribution:

$$P_{//}(R_{//}, \Delta) = \frac{1}{(4\pi D_{//}\Delta)^{1/2}} e^{-|R_{//}|^2/(4D_{//}\Delta)},$$

wherein $D_{//}$ is a spin-diffusion coefficient inside the axon for diffusion parallel to the local axis. Using this Gaussian displacement distribution for $P_{//}$, the associated MR signal $E_{//}(q_{//},\Delta)$ can be expressed using the well-known Stejskal and Tanner formula:

$$E_{//}(q_{//},\Delta) = e^{-4\pi^2|q_{//}|^2\Delta D_{//}}.$$

In some examples, the duration of the applied gradient pulse and the diffusion time are comparable, and the MR signal associated with diffusion parallel to the local axis can be obtained using the effective diffusion time $\Delta_{eff}=\Delta-\delta/3$:

$$P_{//}(R_{//}, \Delta) = \frac{1}{\left(4\pi D_{//}\left(\Delta-\frac{\delta}{3}\right)\right)^{1/2}} e^{-|R_{//}|^2/\left(4D_{//}\left(\Delta-\frac{\delta}{3}\right)\right)},$$

so that $$E_{//}(q_{//}) = e^{-4\pi^2|q_{//}|^2\left(\Delta-\frac{\delta}{3}\right)D_{//}}.$$

When the narrow pulse-field-gradient approximation ($\delta\sim0$, $\delta\ll\Delta$) is satisfied, the MR signal component $E_{\perp}(q_{\perp},\Delta)$ associated with diffusion perpendicular to the local axonal axis can be modeled using, for example, an expression for $E_{\perp}(q_{\perp}, \Delta)$ for restricted diffusion in a cylinder given in P. T. Callaghan and cited above:

$$E_{\perp}(q_{\perp}, \Delta) = \sum_k 4\exp[-\beta_{0k}^2 D_{\perp}\Delta/a^2] \times \left[\frac{(2\pi|q_{\perp}|a)J_0'(2\pi|q_{\perp}|a)}{(2\pi|q_{\perp}|a)^2-\beta_{0k}^2}\right]^2 ++$$
$$\sum_{nk} 8\exp[-\beta_{nk}^2 D_{\perp}\Delta/a^2] \times \frac{\beta_{nk}^2}{\beta_{nk}^2-n^2} \times \left[\frac{(2\pi|q_{\perp}|a)J_n'(2\pi|q_{\perp}|a)}{(2\pi|q_{\perp}|a)^2-\beta_{nk}^2}\right]^2$$

wherein n, k are non-negative integers, $J_n'$ is first derivative of the Bessel function $J_n$, $D_{\perp}$ is a diffusion coefficient motion perpendicular to the restrictive barrier, and a is radius of a cylinder used to approximate axon structure, and $\beta_{nk}$ are values selected to satisfy diffusion-boundary conditions.

In clinical MR measurements, the narrow pulse-field-gradient approximation ($\delta\sim0$, $\delta\ll\Delta$) is typically not satisfied, and the gradient field can sometimes be approximated as a constant field gradient. Alternatively, an asymptotic form of the MR signal $E_{\perp}(q_{\perp},\Delta)$, based on application of a constant-field gradient (and not a pulsed-field gradient) described in C. H. Neuman, "Spin echo of spins diffusing in a bounded medium," J. Chem. Phys. 60:4508-4511 (1974), can be used:

$$E_{\perp}(G_{\perp}, 2\tau) = \exp\left(-\frac{R^4\gamma^2 G_{\perp}^2}{D_{\perp}}\frac{7}{96}\left(2\tau-\frac{99}{112}\frac{R^2}{D_{\perp}}\right)\right),$$

wherein R is an axon radius, $G_{\perp}$ is a component of G perpendicular to the axonal axis, $D_{\perp}$ is a diffusion coefficient for diffusion perpendicular to the local axonal axis, and $2\tau$ is the echo time (TE or $T_E$) of the MR pulse sequence. This asymptotic expression is suitable for many clinical experiments in which the duration $\delta$ of a pulsed-gradient field is approximately equal to the diffusion time $\Delta$ ($\delta\sim\Delta$) and narrow-PFG assumptions are no longer even approximately satisfied. This expression can be rewritten as a function of q:

$$E_{\perp}(q_{\perp}, 2\tau) = \exp\left(-\frac{4\pi^2 R^4|q_{\perp}|^2}{D_{\perp}\tau}\frac{7}{96}\left(2-\frac{99}{112}\frac{R^2}{D_{\perp}\tau}\right)\right).$$

The MR signal $E_{\perp}$ is a Gaussian function of q and can be written more compactly as a function of two dimensionless parameters, $q_{\perp}'=q_{\perp}R$ and $\beta=R^2/(D_{\perp}\tau)$:

$$E_{\perp}(q_{\perp}', \beta) = \exp\left(-4\pi^2\beta|q_{\perp}'|^2\frac{7}{96}\left(2-\frac{99}{112}\beta\right)\right).$$

For $\beta<1$, the diffusion time is sufficient for most spins to reach a diffusion barrier, while for $\beta>1$ the diffusion time is insufficient time for most spins to reach a diffusion barrier. As $\beta$ approaches 2.26, the exponent approaches 0, and $E_{\perp}(q_{\perp}, \beta)$ becomes a constant. For larger $\beta$, the asymptotic solution is physically unrealistic as it grows monotonically as a function of q'. In clinical experiments, even for large-diameter axons, the condition $\beta<2$ is generally satisfied, and this expression can be used. Similarly, values of q'>1 are associated with length scales that are less that the radius of the cylinder, and q'<1 indicates that the length scale probed is larger than the radius of the cylinder.

The above expressions for the parallel and perpendicular signal contributions can be combined to provide an expression for the signal contribution associated with diffusion in the intraxonal volume using $E_r(q,\Delta)=E_{\perp}(q_{\perp},\Delta) E_{||}(q_{||}, \Delta)$:

$$E_r(q, \Delta) = e^{-4\pi^2|q_{//}|^2\left(\Delta-\frac{\delta}{3}\right)D_{//}} \cdot e^{-\frac{4\pi^2 R^4|q_{\perp}|^2}{D_{\perp}\tau}\frac{7}{96}\left(2-\frac{99}{112}\frac{R^2}{D_{\perp}\tau}\right)}.$$

This expression describes the MR signal associated with diffusion in an array of cylinders of radius R.

Computation of $q_\parallel$ and $q_\perp$

Figure 2:
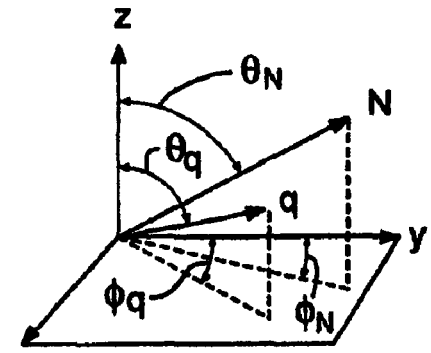
FIG. 2 is a diagram illustrating angular coordinates of a vector q and a local axonal axis N in a spherical coordinate system.

The components $q_\parallel$ and $q_\perp$ can be calculated as:

$$|q_\perp| = |q|\sqrt{1 - (\sin(\theta_q)\sin(\theta_N)\cos(\varphi_q - \varphi_N) + \cos(\theta_q)\cos(\theta_N))^2}$$

and $$|q_\parallel| = |q| \cdot |\sin(\theta_q)\sin(\theta_N)\cos(\varphi_q - \varphi_N) + \cos(\theta_q)\cos(\theta_N)|,$$

wherein angular coordinates of q are $\theta_q$ and $\phi_q$ and angular coordinates of the axonal axis are $\theta_N$ and $\phi_N$ with respect to coordinate axes as illustrated in FIG. 2.

Extra-Axonal (Hindered) Diffusion

Extra-axonal spins exhibit hindered diffusion and can be associated with a 3-dimensional Gaussian displacement distribution. This hindered diffusion can be anisotropic, and can be characterized by an effective diffusion tensor D so that the MR signal component $E_h(q,\Delta)$ can be written as:

$$E_h(q,\Delta) = e^{-4\pi^2 \Delta q^T D q}$$

If this anisotropic diffusion is associated with reflections at the axons and an increased tortuosity produced by the axons, one principal axis of the diffusion tensor D is expected to be parallel or substantially parallel to the local axonal axis. Thus, one eigenvector of D is expected to be parallel to the local axonal axis and two other eigenvectors are expected to be perpendicular to the local axonal axis. Because $q = q_\parallel + q_\perp$, the quadratic form $q^T D q$ can be written as:

$$q^T D q = (q_\perp + q_\parallel)^T D (q_\perp + q_\parallel) = q_\perp^T D q_\perp + q_\parallel^T D q_\parallel + q_\perp^T D q_\parallel +$$
$$q_\parallel^T D q_\perp = q_\perp^T D q_\perp + q_\parallel^T D q_\parallel = q_\perp \cdot q_\perp \lambda_\perp + q_\parallel \cdot q_\parallel \lambda_\parallel = |q_\perp|^2 \lambda_\perp + |q_\parallel|^2 \lambda_\parallel$$

so that $$E_h(q,\Delta) = e^{-4\pi^2 \Delta (|q_\perp|^2 \lambda_\perp + |q_\parallel|^2 \lambda_\parallel)},$$

wherein $\lambda_\parallel$ and $\lambda_\perp$ are principal diffusivities in the extra-axonal space in directions parallel to and perpendicular to the local axonal axis, respectively. This expression shows that spin motion such as diffusion in the parallel and perpendicular directions can also be considered to be statistically independent because the associated MR signal is a product of distributions associated with diffusion parallel and perpendicular to the local axonal axis:

$$E_h(q,\Delta) = e^{-4\pi^2 \Delta (|q_\perp|^2 \lambda_\perp + |q_\parallel|^2 \lambda_\parallel)}$$
$$= e^{-4\pi^2 \Delta |q_\perp|^2 \lambda_\perp} \times e^{-4\pi^2 \Delta |q_\parallel|^2 \lambda_\parallel}$$

In some examples, the narrow PFG approximation is inappropriate, and the applied gradient field can be approximated as a constant-gradient field. In such cases, the diffusion time can be replaced with the effective diffusion time $\Delta_{eff} = \Delta - \delta/3$.

Composite of Restricted and Hindered Solutions

The above expressions can be combined to obtain an approximation for the MR signal associated with hindered diffusion in an extra-axonal volume and restricted diffusion in an intra-axonal volume:

$$E(q,\Delta) = f_h \cdot e^{-4\pi^2 \left(\Delta - \frac{\delta}{3}\right)(|q_\perp|^2 \lambda_\perp + |q_\parallel|^2 \lambda_\parallel)} +$$
$$f_r \cdot e^{-4\pi^2 |q_\parallel|^2 \left(\Delta - \frac{\delta}{3}\right) D_\parallel - \frac{4\pi^2 R^4 |q_\perp|^2}{D_\perp \tau} \frac{7}{96}\left(2 - \frac{99}{112}\frac{R^2}{D_\perp \tau}\right)}$$

In other examples, the form of $E(q,\Delta)$ can be different, but will include a combination of contributions associated with a restricted and a hindered compartment. The form of the contributions can depend on, for example, specimen microstructural properties and/or pulse sequences applied to the specimen.

Multiple Restricted/Hindered Diffusion

A similar analysis can be applied to diffusion associated with multiple restricted and/or hindered volumes:

$$E(q,\Delta) = \sum_{i=1}^{M} f_h^i \cdot E_h^i(q,\Delta) + \sum_{j=1}^{N} f_r^j \cdot E_r^j(q,\Delta), \qquad [2]$$

wherein M is a number of distinct hindered compartments and N is a number of distinct restricted compartments. N and M are not necessarily equal. In this analysis, it is assumed that there is no exchange between compartments during MR signal acquisition.

A particularly useful form of this equation is:

$$E(q,\Delta) = f_h \cdot E_h(q,\Delta) + \sum_{j=1}^{N} f_r^j \cdot E_r^j(q,\Delta),$$

wherein $E_h(q,\Delta)$ is given by $$E_h(q,\Delta) = e^{-4\pi^2 \left(\Delta - \frac{\delta}{3}\right)(q^T D q)},$$

and D is the effective diffusion tensor. At low q-values, the effective diffusion tensor represents a powder-average of all diffusion tensors in the various hindered sub-compartments, and a single tensor can be used to approximate the signal at low q-values.

Modeling of Brain Gray Matter

In another example, a similar division of MR signal contributions for brain gray matter can be based on signal contributions associated with intra-neuronal and extra-neuronal specimen portions. Gray matter fibers are dendrites and somatic processes that are much smaller in diameter than intra-axonal spaces in white matter. The structures of gray matter are quasi-randomly oriented rather than orientationally coherent. In addition, regions of hindered anisotropic diffusion surrounding gray matter structures are microscopic, and signals associated with gray matter typically are associated with an aggregation of microscopic structures that have appreciable exchange. For example, small fibers in which diffusion is restricted can be assumed to be randomly oriented and uniformly distributed within a macroscopic gray-mattervolume element (voxel). This results in a similar expression for analogous formula for the restricted region in the narrow PFG limit:

$$E_\perp(q_\perp, \Delta) = \sum_k 4\exp[-\beta_{0k}^2 D_\perp \Delta / a^2] \times \left[\frac{(2\pi|q|a)J_0'(2\pi|q|a)}{(2\pi|q|a)^2 - \beta_{0k}^2}\right]^2 +$$
$$+ \sum_{nk} 8\exp[-\beta_{nk}^2 D_\perp \Delta / a^2] \times \frac{\beta_{nk}^2}{\beta_{nk}^2 - n^2} \times \left[\frac{(2\pi|q|a)J_n'(2\pi|q|a)}{(2\pi|q|a)^2 - \beta_{nk}^2}\right]^2$$

or in the asymptotic limit of the constant gradient assumption:

$$E_\perp(q, 2\tau) = \exp\left(-\frac{4\pi^2 R^4 |q|^2}{D_\perp \tau} \frac{7}{96}\left(2 - \frac{99}{112}\frac{R^2}{D_\perp \tau}\right)\right)$$

with the parallel component of the signal being given by:

$$E_{//}(q_{//}) = e^{-4\pi^2 |q|^2 \Delta D_{//}}.$$

Thus, the net contribution from this restricted compartment is:

$$E_r(q, \Delta) = E_\perp(q_\perp, \Delta)E_{//}(q_{//}, \Delta)$$
$$= e^{-4\pi^2 |q|^2 \left((D_{//}\Delta) + \frac{R^4}{D_\perp \Delta}\frac{7}{96}\left(2 - \frac{99}{112}\frac{R^2}{D_\perp \Delta}\right)\right)}$$

assuming $\tau = \Delta$.

It can be assumed that diffusion in the extra-axonal volume is anisotropic but randomly oriented and uniformly distributed within a gray-matter voxel. For convenience, it is assumed that there is no exchange between intra- and extra-neuronal volumes. A powder average over these individual compartments can be used to estimate E(q) for gray matter as a powder average on a microscopically anisotropic but macroscopically isotropic hindered medium:

$$E_h(q, \Delta) = e^{-4\pi^2 \Delta |q|^2 \left(\frac{\lambda_{//} + 2\lambda_\perp}{3}\right)}$$

wherein $$\frac{\lambda_{//} + 2\lambda_\perp}{3}$$

can be interpreted as an orientationally-averaged average diffusion coefficient. See, for example, Kärger et al., "Principles and applications of self-diffusion measurements by NMR," Adv. Magn. Reson. 12:1-89 (1988). A similar division into hindered and restricted portions can be expressed as:

$$E(q,\Delta) = f_h \cdot E_h(q,\Delta) + f_r \cdot E_r(q,\Delta).$$

This expression exhibits a decay that is clearly not described by a single Gaussian. Because the sub-compartments are microscopic, the compartments can exhibit fast exchange so that:

$$E(q,\Delta) = E_h(q,\Delta)^{f_h} \times E_r(q,\Delta)^{f_r}$$

which becomes:

$$E(q, \Delta) = e^{-4\pi^2 |q|^2 \left(\Delta\left(\frac{\lambda_{//} + 2\lambda_\perp}{3}\right)f_h + \left((\Delta D_{//}) + \frac{R^4}{D_\perp \Delta}\frac{7}{96}\left(2 - \frac{99}{112}\frac{R^2}{D_\perp \Delta}\right)\right)f_r\right)}$$

assuming $\tau = \Delta$. This expression exhibits a decay consistent with a single Gaussian although its features can depend on experimental parameters, particularly diffusion time and fiber dimensions. A formula for an effective diffusivity can be obtained from the exponent above.

Johnson Noise

Measured signals can be modeled in the presence of noise as:

$$E(q, \Delta) = \sqrt{(f_h \cdot E_h(q, \Delta) + f_r \cdot E_r(q, \Delta))^2 + \eta^2}, \text{ or}$$
$$E(q, \Delta) = \sqrt{(f_h \cdot E_h(q, \Delta) + f_r \cdot E_r(q, \Delta) + \eta)^2 + \eta^2}$$

wherein a random variable η representing the Johnson-noise contribution can have a mean of zero and a standard deviation σ. Other noise models can be used taking into account the Rician character of the rectified noise present in the magnitude MR signals. Noise remediation strategies can also be employed to reduce or remove background noise present in the MR system, primarily the RF receiver.

Modeling Summary

Signal portions associated with hindered diffusion $E_h(q,\Delta)$ are generally larger than other signal portions for small values of q, and some portions of an associated model signal can be fit to measured signals based on low q value measurements. Thus, the principal diffusivities $\lambda_{//}$ and $\lambda_\perp$ in the extra-axonal space can largely be estimated based on the Gaussian dependence of signal as a function of q. The signal portion associated with restricted diffusion $E_r(q,\Delta)$ is more prominent for larger for large q values. Thus, parameters associated with restricted diffusion in the intra-axonal compartment, such as $D_\perp$ can be determined based on measurements associated with larger values of q. Model parameters to be estimated can depend on the functional form selected for the signal $E_r(q,\Delta)$, and in particular for the contribution $E_\perp(q_\perp,\Delta)$. In other examples, large q and small q measurements can be considered simultaneously as model parameters are obtained. If two (or more) populations of nerve bundles are present or if nerve fibers are bent in some regions, model expressions can be based on distributions of nerve-fiber diameter and nerve-fiber orientation. Johnson noise can be included as a model parameter as well.

Signal Acquisition

Figure 3:
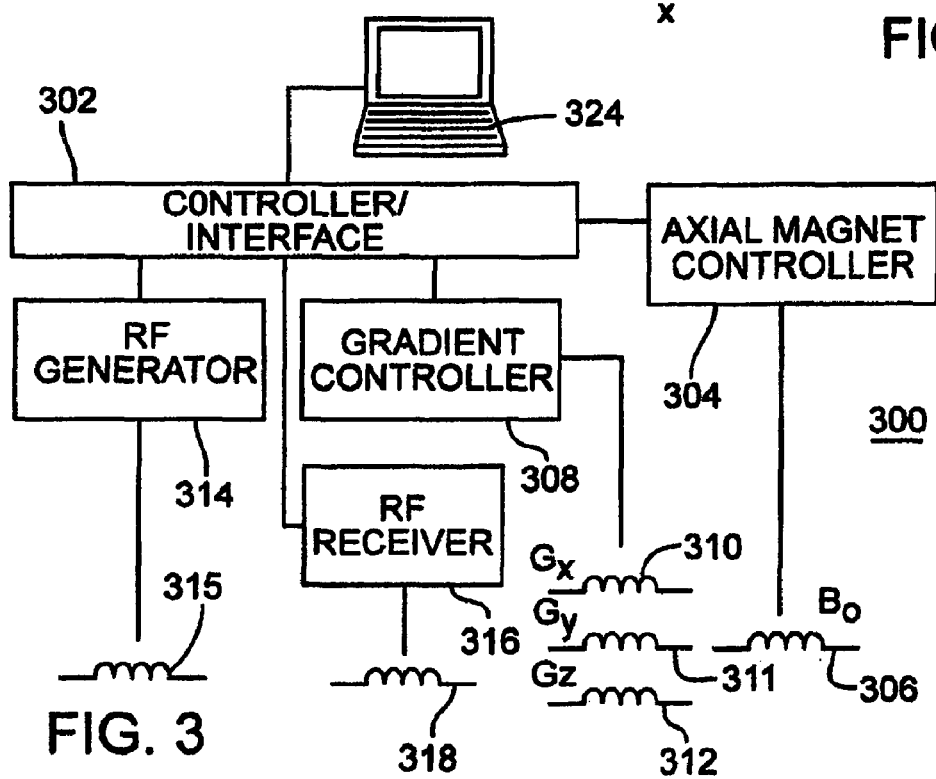
FIG. 3 is a schematic diagram of a magnetic resonance imaging (MRI) system.

MR signals that are modeled as described above can be obtained using an MRI apparatus 300 as illustrated in FIG. 3. The apparatus 300 includes a controller/interface 302 that can be configured to apply selected magnetic fields such as constant or pulsed fields to a specimen. An axial magnet controller 304 is in communication with an axial magnet 306 that is generally configured to produce a substantially constant magnetic field $B_0$ which for purposes of convenient description, is aligned parallel to a z-axis of a reference coordinate system. A gradient controller 308 is configured to apply a constant or time-varying gradient magnetic field in a selected direction or in a set of directions using magnet coils 310-312 to produce respective magnetic field gradients $G_x$, $G_y$, $G_z$ or combinations thereof. An RF generator 314 is configured to deliver one or more RF pulses to a specimen using a transmitter coil 315. An RF receiver 316 is in communication with a receiver coil 318 and is configured to detect or measure net magnetization of spins. Imaging gradients can be applied with the same hardware used to apply the diffusion gradients.

The gradient controller 308 can be configured to produce pulses or other gradient fields along one or more axes. By selection of such gradients as described by, for example, Basser, U.S. Pat. No. 5,539,310, an effective diffusion tensor can be found. In addition, the gradient controller 308 can be configured to apply gradient pulses or other gradient magnetic fields of different magnitudes (i.e., different q-values), and associated MR signals can be detected by the RF receiver 316. A computer 324 or other processing system such as a personal computer, a workstation, a personal digital assistant, or a networked computer can be provided for data acquisition, control, processing and/or analysis. The computer 324 generally includes a hard disk, a removable storage medium such as a floppy disk or CD-ROM, and other memory such as random access memory (RAM). Computer-executable instructions for data acquisition, processing, analysis, communication via a local area network or a wide area network, or control can be provided on a floppy disk or other data storage medium, or delivered to the computer 324 via a local area network, the Internet, or other network. Signal acquisition, instrument control, and signal analysis can be performed with distributed processing. For example, signal acquisition and signal analysis can be performed at different locations.

Figure 4:
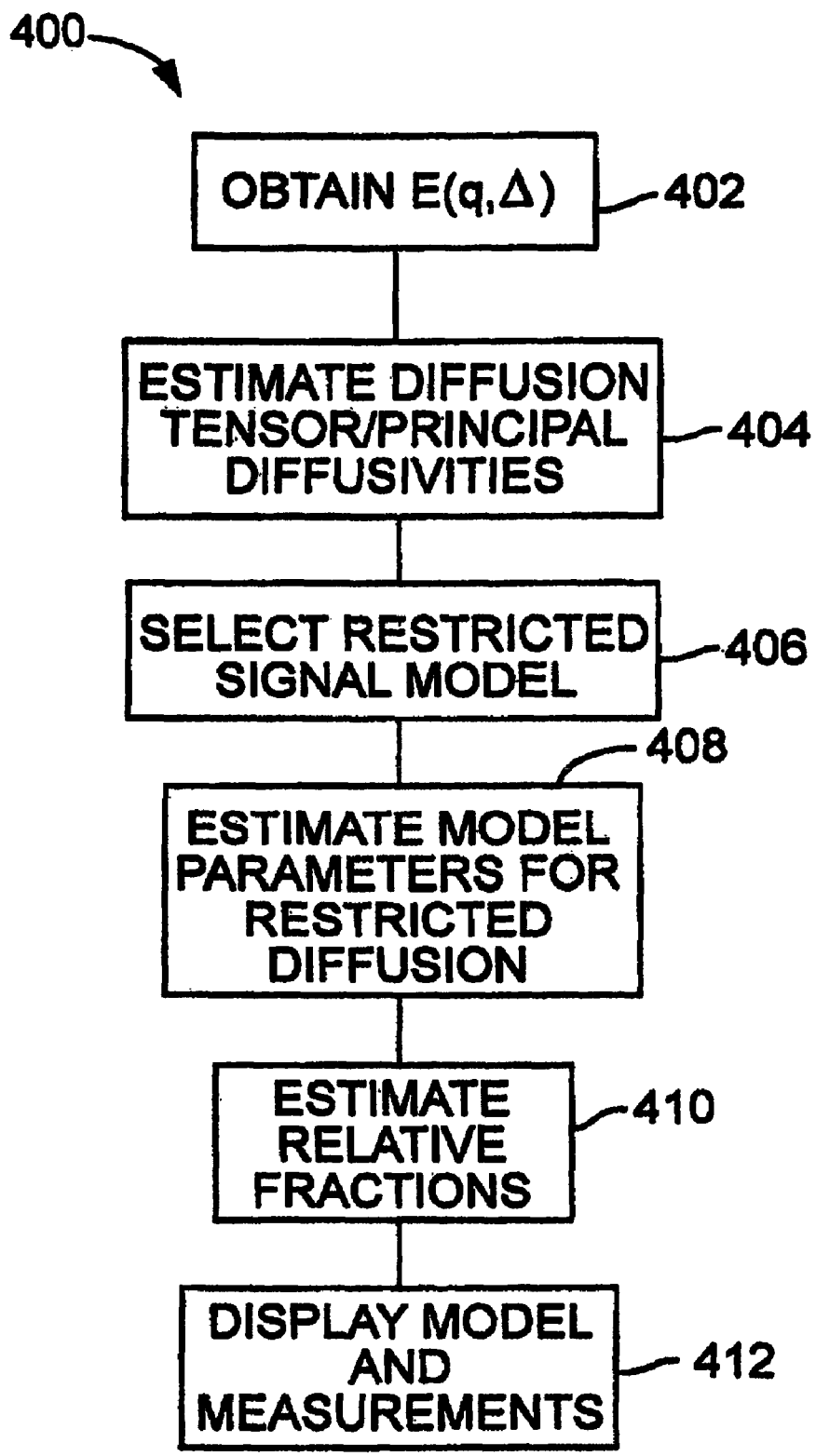
FIG. 4 is a schematic block diagram illustrating a method for modeling magnetic resonance (MR) signals and extracting model parameters associated with hindered and/or restricted spin diffusion in anisotropic specimens.

A representative method 400 is illustrated in FIG. 4. In a step 402, MR signals $E(q,\Delta)$ are obtained for variety of q-values and q-directions. Signals can be obtained by fixing a magnitude and duration of an applied pulsed-gradient magnetic field or effective magnitude of other spin-encoding magnetic field (i.e., fixing q), and varying the direction in which the encoding field is applied. After signals associated with the various directions are obtained, the q is changed and another series of signals at the various directions is obtained. Alternatively, signals can be obtained by fixing the direction of the applied encoding field and varying q. The direction of the encoding field can then be changed, and signals as a function of q can be obtained. Other signal acquisition sequences can be used.

After obtaining the MR signal $E(q,\Delta)$ for a variety of encoding field directions, model parameters associated with hindered spin diffusion are determined in a step 404. Typical model parameters determined in this step can include principal diffusivities $\lambda_{//}$, $\lambda_\perp$ and an orientation of the local axonal axis and can be based on diffusion tensor methods. A signal model for restricted diffusion perpendicular to the local axonal axis is selected in a step 406. Representative signal models include the expressions of Neuman and Callaghan described above and those described in P. van Gelderen et al., "Evaluation of restricted diffusion in cylinders. Phosphocreatine in rabbit leg muscle," J. Magn. Reson. B. 103:255-260 (1994). Model parameters associated with the selected model are obtained in step 408. Typical parameters include diffusion constants $D_{//}$ and $D_\perp$ for diffusion parallel and perpendicular to the local axonal axis and a cylinder radius. In a step 410, relative fractions of spins that exhibit hindered and restricted diffusion can be estimated. In a step 412, modeled signals can be computed and displayed with respect to measured signals, or compared with one or more baseline or control values associated with normal tissues or diseased tissues.

The method 400 of FIG. 4 shows steps performed in a specific order, but these steps can be performed in different orders, and model parameters for restricted and hindered signal components can be estimated in a common step or in a series of steps. Different models can be selected for other specimens, and the cylindrical model described herein is only a representative example.

EXAMPLE APPLICATIONS

Figure 5A:
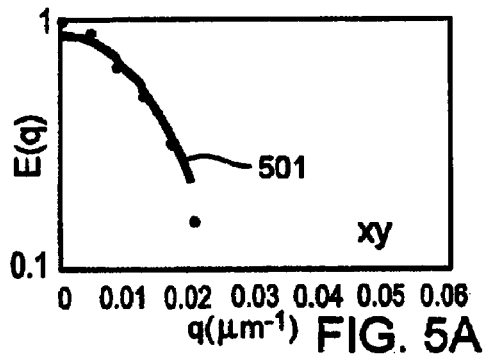
FIGS. 5A-5F are respective graphs of relative MR signal strength obtained from human corpus callosum as a function of a magnitude of q for gradient fields applied in different directions. Measurements are indicated as data points and modeled signal strengths are shown as continuous curves. Model parameters for modeled signal strengths are f=0.60, $D_{//}=1.1\times10^{-5}$ cm$^2$/s, $\lambda_{//}=1.1\times10^{-5}$ cm$^2$/s, $\lambda_{\perp}=0.49\times10^{-5}$ cm$^2$/s, $\theta=89.9°$, and $\phi=7.8°$.
Figure 5D:
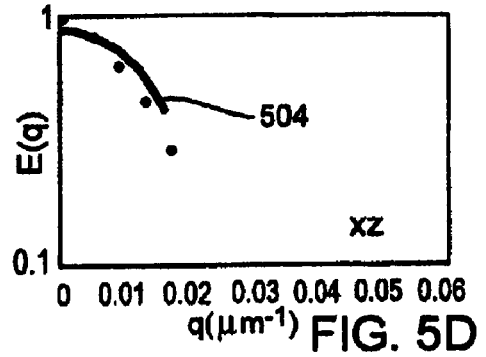
Figure 5B:
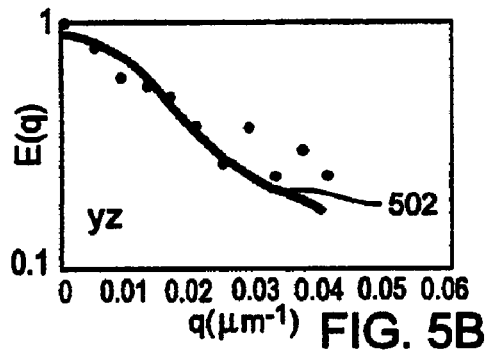
Figure 5E:
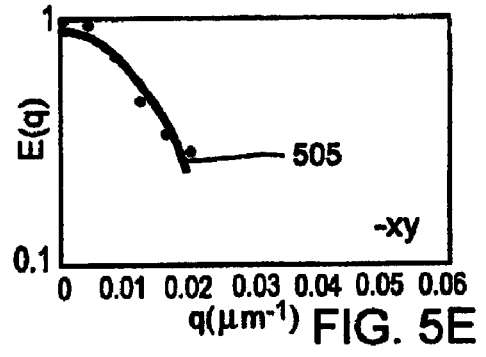
Figure 5C:
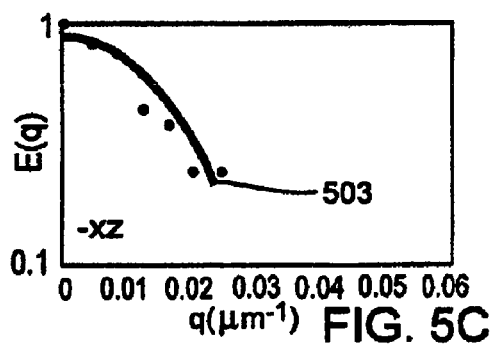
Figure 5F:
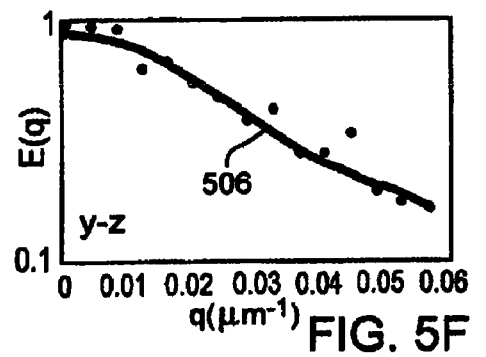
Figure 5G:
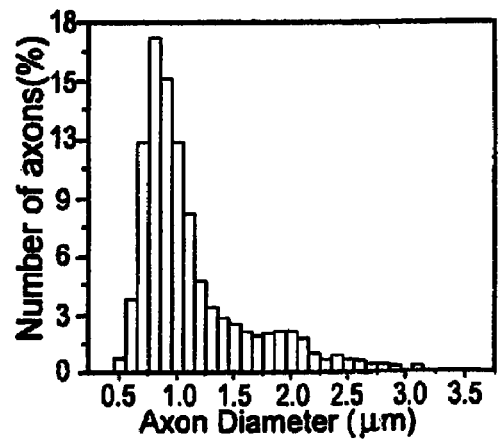
FIG. 5G is a graph illustrating a histological axon-diameter distribution used to compare with or validate the modeled signal strengths of FIGS. 5A-5F.

FIGS. 5A-5F are respective graphs of relative MR signal strength obtained from a voxel in a corpus callosum of a healthy human subject as a function of q for gradient fields applied in different directions. Directions of the gradient fields are indicated on the figures. For example, the gradient magnetic field corresponding to FIG. 5A was applied in an xy-direction, i.e., in a direction parallel to a sum of unit vectors x and y parallel to an x-axis and a y-axis, respectively, of an xyz-coordinate system. A maximum static magnetic field was 1.5 T, and a maximum b-value was 14,000 s/mm². The diffusion time $\Delta$ was 71 ms, and the effective duration $\delta$ of the gradient field was 65 ms. A repetition period was 2000 ms, and an echo time $T_E$ was 167 ms. Curves 501-506 are estimated signals based on model parameters as described above and using an axon-diameter distribution shown in FIG. 5G. Model parameters for modeled signal strengths are f=0.60, $D_{//}$=1.1×10⁻⁵ cm²/s, $\lambda_{//}$=1.1×10⁻⁵ cm²/s, $\lambda_\perp$=0.49× 10⁻⁵ cm²/s, f=0.6, θ=0.1°, and φ=7.8°, wherein the angles θ and φ are angular coordinates of the axonal axis with respect to the coordinate axis of the MRI system. Referring to FIGS. 5A-5F, the axonal axis appears to be aligned with or nearly aligned with the x-axis because gradient fields applied perpendicular to the x-axis appear to result in signals decreasing more slowly as a function of q in comparison with signal decreases associated with other directions.

FIGS. 6A-6F are respective graphs of relative MR signal strengths obtained from rat sciatic nerve as a function of q for gradient fields applied in different directions. Directions are indicated on the figures. For example, the gradient magnetic field corresponding to FIG. 6A was applied in an xy-direction, i.e., in a direction parallel to a sum of unit vectors x and y parallel to an x-axis and a y-axis, respectively, of an xyz-coordinate system. Measurements are indicated as data points, and modeled signal strengths are shown as continuous curves 601-606 that correspond to signal estimates based on model parameters. Model parameters for modeled signal strengths are f=0.3, $D_{//}$=1.18×10⁻⁵ cm²/s, $\lambda_{//}$=1.1×10⁻⁵ cm²/s, $\lambda_\perp$=0.45×10⁻⁵ cm²/s, θ=3°, and φ=50°. Reduction in signal amplitude as a function of q shown in FIGS. 6A and 6D is noticeably less than that exhibited for gradient fields applied in other directions. Curves exhibiting a rapid decay are dominated by hindered diffusion, whereas curves exhibiting slow decay are dominated by restricted diffusion. Therefore, the directions xy(x+y) and −xy(x−y) are associated with restricted diffusion.

Figure 7A:
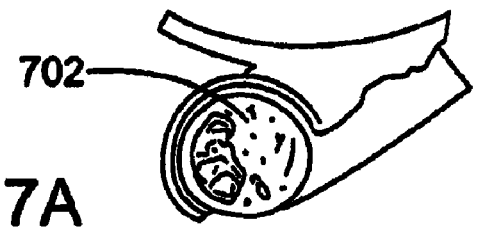
FIGS. 7A-7C are schematic diagrams illustrating respective stages in the development of a myelin sheath.
Figure 7B:
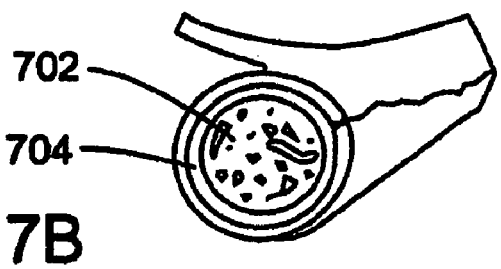
Figure 7C:
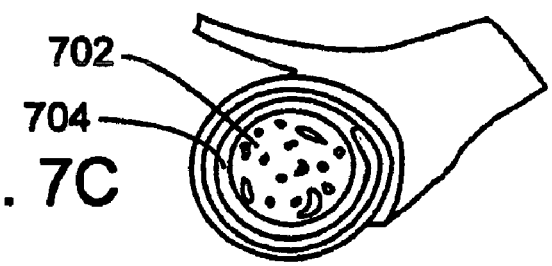

FIGS. 7A-7C illustrate an axon 702 and a surrounding myelin sheath 704 and correspond to successive respective stages in neuron development. Development of the myelin sheath 704 is apparent. With respect to a graph (not shown) of relative MR signals as a function of q for various stages of neuron development ranging from three days to ten weeks, it can be observed that signals associated with neuronal development at ten weeks decrease more slowly as a function of b than earlier developmental stages, and such signals can be associated with increases in restricted diffusion caused by neuron development and may be associated with development of the myelin sheath 704. Model parameters can be associated with neuron development. For example, abnormalities associated with properties of the myelin sheath may be identified for diagnosis and treatment.

Figure 8:
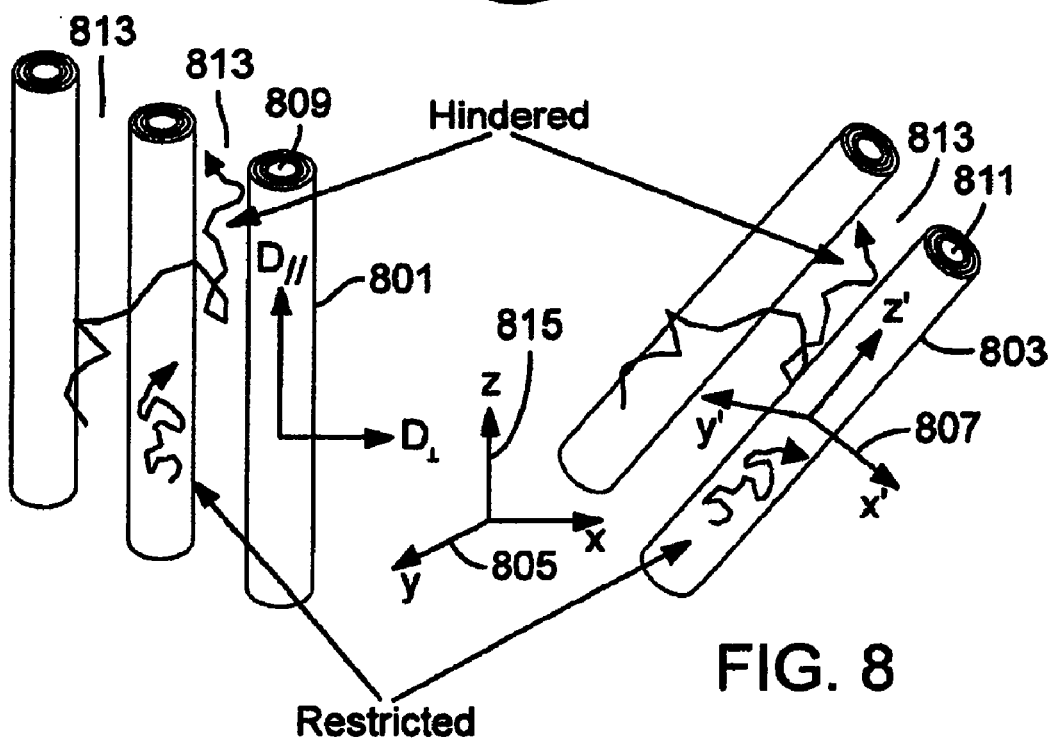
FIG. 8 illustrates a representative specimen that includes a first set and a second set of cylindrical restricted volumes aligned with respect to a first axis and a second axis, respectively.
Figure 9:
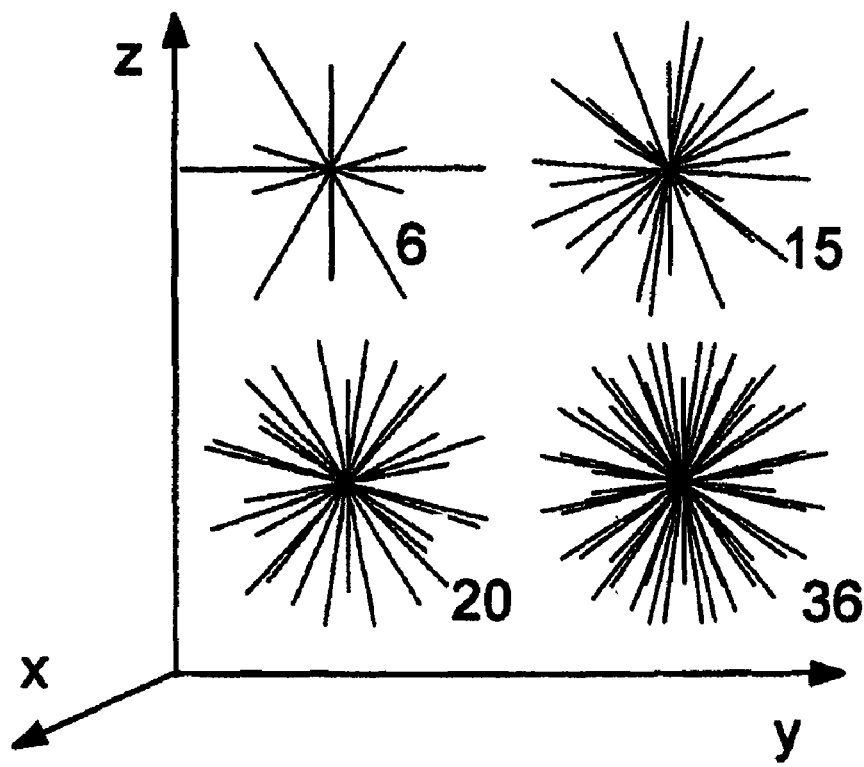
FIG. 9 illustrates representative sets of 6, 15, 20, and 36 directions along which a pulsed-field gradient ("PFG") MR sequence can be applied to obtain diffusion-weighted images or signals.

In some examples, specimens include microstructures that are aligned with respect to two or more axes. With reference to FIG. 8, such a specimen includes representative neurons 801, 803 that are aligned with respect to coordinate axes 805, 807, respectively. For convenience, white matter is represented in FIG. 8 as cylindrical fibers. The coordinate axes 805, 807 are rotated with respect to each other. The rotation of the fibers 803 can be described by rotation angles $\phi_n$ and $\theta_n$, wherein $\phi_n$ is a counter-clockwise rotation of the fibers 803 with respect to an xy-plane of the coordinate axes 805, and $\theta_n$ is a pitch from a z-axis 815. A restricted component can be associated with translational diffusion from water situated in intra-axonal spaces 809, 811 while a hindered component can be associated with translational water diffusion in an extra-axonal space 813. The estimation of the fiber orientation can be done by applying pulsed-gradient magnetic fields in a plurality of directions, typically six or more directions. The orientations of the pulsed-field gradients can also be described using spherical coordinates angles $\phi_q$ and $\theta_q$. Representative sets of six, fifteen, twenty, and thirty-six pulsed-field gradient directions are illustrated in FIG. 9.

Figure 10:
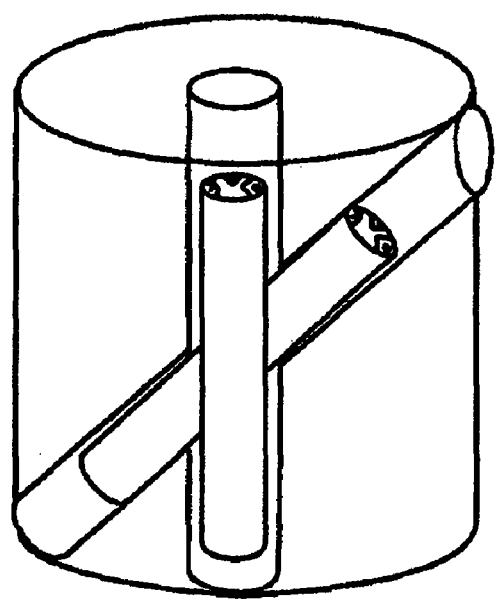
FIG. 10 illustrates a relative alignment of a first cylindrical restricted volume and a second cylindrical volume with respect to the PFG directions of FIG. 9.
Figure 21A:
FIGS. 21A-21D illustrate surfaces showing diffusion distances as a function of direction based on application of PFG MR sequences with signals associated with noise floor values (NFs) of 0.03, 0.06, 0.09, and 0.12, respectively, for fibers arranged at an angle relative to each other.
Figure 21B:
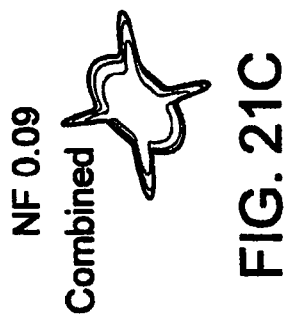
Figure 21C:
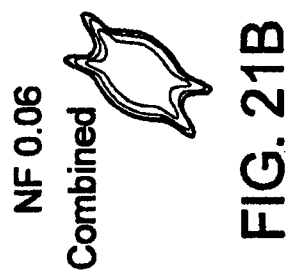
Figure 21D:
Figure 22A:
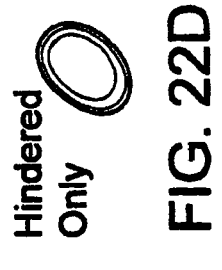
FIGS. 22A-22D and 23A-23D illustrate surfaces showing diffusion distances as a function of direction based on application of PFG MR sequences for the hindered diffusion component and the restricted diffusion component, respectively, and associated with noise floor values (NFs) of 0.03, 0.06, 0.09, and 0.12, respectively, for two fibers arranged at an angle relative to each other.
Figure 22B:
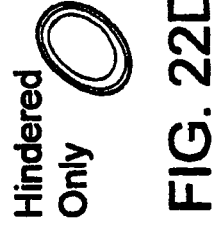
Figure 22C:
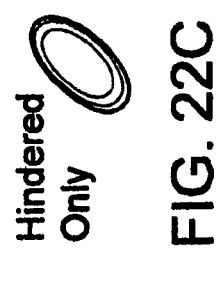
Figure 22D:
Figure 23A:
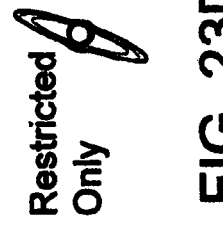
Figure 23B:
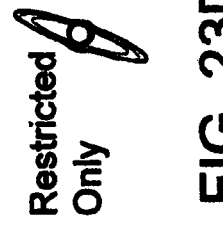
Figure 23C:
Figure 23D:

Additional examples are described below. Excised spinal cords were scanned on a 7 T spectrometer equipped with a Micro2.5 gradient system (Bruker BioSpin Corp.) with a maximum gradient strength of 100 G/cm in three orthogonal directions. A spinal cord was freshly excised from a previously sacrificed pig and placed in formalin solution (4%). A section (2 cm) of cervical spinal cord was cut in half and the two pieces were placed in the apparatus as shown in FIG. 10.

Diffusion experiments were performed using a pulsed-gradient spin-echo sequence with the following parameters: TR=2000 ms, TE=200 ms, $\Delta$=150 ms, and $\delta$=40 ms. Maximum values of b and q were about 44,000 s/mm$^2$ and 89.4/mm, respectively. The field of view (FOV) was 5 cm and the slice thickness was 15 mm to include both spinal cord crossing sections (see FIG. 10). Pulsed gradients were incremented from zero to about 5.25 G/cm in 16 equal steps and measured in 31 distinct gradient directions (see FIG. 9). The total number of images was 496 and the acquisition time per direction was about 40 minutes. The total experimental time was about 18 hours. Representative experimental data and data fits based on a single fiber (one hindered and one restricted compartment) in a region of homogeneous white matter are shown in FIGS. 24A1-24A3. In regions associated with crossing fibers, data fits are based on a two-fiber model (one hindered and two restricted compartments).

In other examples, simulated signal-decay data were produced using the models described above. The signal decay from a homogeneously oriented array of axons was produced using Eq. [1], which combines one hindered and one restricted compartment. Noise was added in quadrature as explained in Pierpaoli and Basser, "Toward a quantitative assessment of diffusion anisotropy," Magn. Reson. Med. 36:893-906 (1996). The signal decay for the two-fiber model was produced using Eq. [2] by combining two sets of hindered and restricted compartments. Input parameters for the signal-decay simulation were: population fraction of each of the compartments, alignment of the fibers in a spherical coordinates system, parallel- and perpendicular-diffusion coefficients of the hindered compartments ($\lambda_{//}$ and $\lambda_\perp$, respectively), and the parallel diffusion coefficient of the restricted component ($D_{par}$ or $D_{//}$).

FIGS. 24B-24C illustrate the superior effectiveness of CHARMED-based methods to conventional diffusion-tensor imaging as applied to the pig spinal cord specimen (two spinal cord sections crossing at an angle of 45 degrees). Numerical data are included in Table 4. Referring to FIG. 24B, data fits associated with conventional diffusion-tensor imaging techniques (low b-values, one hindered compartment) show dominant fiber directions in non-overlapping regions 2402, 2404, 2406, 2408, but in a region 2410 associated with fiber overlap, the iso-probability ellipsoids fail to reveal dominant fiber directions. In contrast, CHARMED-based iso-probability plots shown in FIG. 24C, based on both low and high b-values using a model having one hindered and one restricted compartment (non-overlap regions) or two restricted compartments (fiber-crossing regions), clearly show fiber directions in all regions and clearly identify the two distinct fiber populations. As FIGS. 24B-24C show, CHARMED methods provide reliable estimates of fiber orientations even in regions where fibers cross, while a conventional DTI method typically provides only an average fiber orientation and fails to provide two-fiber orientations.

TABLE 4

CHARMED numerical data for pig spinal cord phantom. Models include 1 hindered and 1 restricted compartments (1h1r), 1 hindered and 2 restricted (1h2r), compartments, or 1 hindered compartment (1h). $\lambda_1 = \lambda_{par} = \lambda_{||}$, and $\lambda_2$ and $\lambda_3$ represent $\lambda_{perp} = \lambda_\perp$ in units of $10^5$ cm$^2$/s.

| | 45° fiber | | 90° fiber | | Crossing Pixels | | |
| | | | | | 1h2r | | |
| Model | 1h1r | 1h | 1h1r | 1h | 45° fiber | 90° fiber | 1h |
|---|---|---|---|---|---|---|---|
| $f_h$ | 0.75 ± 0.05 | — | 0.63 ± 0.06 | — | 0.68 ± 0.04 | | — |
| $\lambda_1^2$ | 0.54 ± 0.15 | 0.34 ± 0.07 | 0.88 ± 0.24 | 0.44 ± 0.10 | 1.48 ± 0.10 | | 0.34 ± 0.05 |
| $\lambda_2^2$ | 0.13 ± 0.05 | 0.14 ± 0.03 | 0.19 ± 0.05 | 0.12 ± 0.03 | 0.51 ± 0.14 | | 0.13 ± 0.02 |
| $\lambda_3^2$ | 0.07 ± 0.04 | 0.10 ± 0.03 | 0.09 ± 0.03 | 0.09 ± 0.02 | 0.11 ± 0.05 | | 0.10 ± 0.02 |
| $\phi_h$ | 80 ± 5 | 79 ± 5 | 86 ± 7 | 88 ± 6 | 10 ± 2 | | 82 ± 6 |
| $\phi_h$ | 49 ± 7 | 50 ± 7 | 87 ± 5 | 88 ± 5 | 89 ± 4 | | 74 ± 6 |
| $f_r$ | 0.21 ± 0.03 | — | 0.36 ± 0.05 | — | 0.08 ± 0.03 | 0.23 ± 0.05 | — |
| $\phi_r$ | 77 ± 6 | — | 88 ± 5 | — | 73 ± 22 | 83 ± 6 | — |
| $\phi_r$ | 47 ± 6 | — | 92 ± 7 | — | 44 ± 11 | 104 ± 4 | — |
| Noise | 0.10 ± 0.02 | — | 0.11 ± 0.03 | — | 0.09 ± 0.04 | | — |
| FA | 0.78 ± 0.12 | 0.60 ± 0.10 | 0.80 ± 0.07 | 0.72 ± 0.09 | 0.78 ± 0.05 | | 0.58 ± 0.08 |
| N | 42 | 42 | 45 | 45 | 27 | | 27 |

FIGS. 11-23 show three-dimensional surfaces illustrating various aspects of the disclosed technology. In order to show the three-dimensional character of the surfaces, FIGS. 11-23 utilize thin contour lines. The three-dimensional surfaces can alternatively be displayed as three-dimensionally-shaded color or gray-scale surfaces.

FIGS. 11A-11D represent displacement distribution functions obtained as 3-dimensional fast Fourier transforms (FFTs) of simulated MR signals associated with a single fiber aligned 30 degrees below the x direction. The data were generated using a model with one hindered component and one restricted component with the following parameters: $f_h=0.7$, $f_r=0.3$, $\theta_r=\theta_h=-30°$, $\phi_r=\phi_h=90°$, $\lambda_1=0.35$ μm$^2$/ms, $\lambda_2=0.8$ μm$^2$/ms, $D_{par}=1$ μm$^2$/ms, a noise floor (NF) of 0.03, and sets of 36, 20, 15, and 6 gradient directions, respectively. FIGS. 12A-12D illustrate the hindered component and FIGS. 13A-13D illustrate the restricted component. The 3-D FFT shape of the restricted component is, as expected, narrower and longer than the hindered-diffusion ellipsoid for all measured directions. Visually, no major differences are seen between the gradient schemes, and indeed all simulations provided similar numbers to real values. However, numerical analysis of the data and the simulation error shows that the error is multiplied by almost three between the 31 and 6 gradient directions schemes.

FIGS. 14A-14D represent displacement distribution functions obtained as 3-D FFTs of simulated signal decay for two fibers aligned 90 degrees with respect to each other. The data were generated using a model with one hindered component and two restricted components 90 degrees apart with the following parameters: $f_{h1}=0.35$, $f_{h2}=0.35$, $f_{r1}=0.15$, $f_{r2}=0.15$, $\theta_{r1}=\theta_{h1}=135°$, $\phi_{r1}=\phi=90°$, $\theta_{r2}=\theta_{h2}=45°$, $\phi_{r2}=\phi_{h2}=90°$, $\lambda_1=0.3$ μm$^2$/ms, $\lambda_2=0.8$ μm$^2$/ms, $D_{par}=1$ μm$^2$/ms, NF=0.03, and sets of 36, 20, 15, and 6 gradient directions, respectively. In some cases, more than one set of data is generated for some directions. For example, signals associated with 36 gradient directions can include five signals associated with the z-axis so that 31 independent directions are used. A fitting procedure was performed using a combined model of two restricted components and one hindered component (FIGS. 14A-16D) or a model of only two hindered components that was sampled only in the low-q regime (FIGS. 17A-17C). FIGS. 15A-15D illustrate the hindered component and FIGS. 16A-16D illustrate the restricted component. FIGS. 17A-17C illustrate simulation results based on two hindered compartments. The combined model was able to predict with high accuracy the 3D alignment of the two fibers as well as the hindered-compartment parameters and the population ratios. However, when using the 6-direction gradient scheme, the model predicted incorrect results for both compartments. The mean error of the fitting procedure was more than ten times higher in the six directions than in the 36 directions. The two-tensor model was not able to produce the original 3-D alignment of the fibers even though the fit error was small.

FIGS. 18A-18D represent displacement distribution functions obtained as 3-D FFTs of simulated signal decay for two fibers aligned 30 degrees relative to each other. The data were generated using a model with two hindered components and two restricted components with the following parameters: $f_{h1}=0.35$, $f_{h2}=0.35$, $f_{r1}=0.15$, $f_{r2}=0.15$, $\theta_{r1}=\theta_{h1}=30°$, $\phi_{r1}=\phi_{h1}=90°$, $\theta_{r2}=\theta_{h2}=60°$, $\phi_{r2}=\phi_{h2}=90°$, $\lambda_1=0.3$ μm$^2$/ms, $\lambda_2=0.8$ μm$^2$/ms, $D_{par}=1$ μm$^2$/ms, NF=0.042 and sets of 36, 20, 15, and 6 gradient directions, respectively. FIGS. 19A-19D illustrate the hindered component and FIGS. 20A-20D illustrate the restricted component. Using 36 gradient directions it is possible to reproduce the 3-D alignment of the fibers. With 20 gradient directions, the error in the resolution of the fibers is increased, but is nevertheless close to original values. The 15 and 6 gradient directions produce incorrect values of the fiber direction, diffusion coefficient, and population fractions.

FIGS. 21A-21D represent displacement distribution functions obtained as 3-D FFTs of simulated signal decay for two fibers aligned 45 degrees relative to each other. The data were generated using a model with two hindered components and two restricted components with the following parameters: $f_{h1}=0.35$, $f_{h2}=0.35$, $f_{r1}=0.15$, $f_{r2}=0.15$, $\theta_{r1}=\theta_{h1}=25°$, $\phi_{r1}=\phi_{h1}=90°$, $\theta_{r2}=\theta_{h2}=70°$, $\phi_{r2}=\phi_{h2}=45°$, $\lambda_1=0.3$ μm$^2$/ms, $\lambda_2=0.8$ μm$^2$/ms, $D_{par}=1$ μm$^2$/ms, a set of 36 gradient directions were used, and NF was 0.03, 0.09, 0.12, or 0.18. The fitting procedure was done by a combined model of two restricted components and one hindered component. FIGS. 22A-22D illustrate the hindered component and FIGS. 23A-23D illustrate the restricted component. As noise floor increases, the accuracy of the fit is reduced. With noise floor of 0.127, the 3-D alignment of the fibers as well as other fit parameters (diffusion coefficients, population fractions) tend to become unreliable.

Simulation data comparing CHARMED and conventional DTI methods are shown in Tables 1-2 for fibers oriented at 90 degrees (Table 1) and 30 degrees (Table 2). Table 1 shows that two tensor DTI methods are unable to provide fiber orientations, while CHARMED methods can provide satisfactory results if a sufficient number of gradient directions are used.

TABLE 1

Simulation values for fibers oriented at 90 degrees.

| | 1 Hindered + 2 Restricted Model | | | | 2 Hindered (Two-tensor) | | | |
|---|---|---|---|---|---|---|---|---|
| | Simulation | Fitted Values | | | | Simulation | Fitted Values | | |
| # Directions | Values | 31 | 20 | 6 | # Directions | Values | 31 | 20 | 6 |
| $f_h$ | 0.7 | 0.7 | 0.68 | 0.53 $f_{h1}$ | | 0.5 | 0.49 | 0.49 | 0.64 |
| $\lambda_\parallel^1$ | 0.8 | 0.55 | 0.63 | 1.06 $f_{h2}$ | | 0.5 | 0.51 | 0.51 | 0.28 |
| $\lambda_\perp^1$ | 0.3 | 0.41 | 0.42 | 0.43 $\lambda_{\parallel h1}^1$ | | 0.8 | 0.88 | 0.79 | 0.85 |
| $f_{r1}$ | 0.15 | 0.15 | 0.14 | 0.28 $\lambda_{\perp h1}^1$ | | 0.3 | 0.50 | 0.55 | 0.33 |
| $f_{r2}$ | 0.15 | 0.15 | 0.19 | 0.13 $\lambda_{\parallel h2}^1$ | | 0.8 | 0.50 | 0.35 | 0.27 |
| $\Phi_{r1}$ | 135 | 136 | 135 | 152 $\lambda_{\perp h2}^1$ | | 0.3 | 0.18 | 0.21 | 0.06 |
| $\phi_{r1}$ | 90 | 89 | 95 | 66 $\Phi_{h1}$ | | 135 | 72 | 2 | 164 |
| $\Phi_{r2}$ | 45 | 44 | 45 | 116 $\phi_{h1}$ | | 90 | 109 | 5 | 92 |
| $\phi_{r2}$ | 90 | 92 | 88 | 26 $\Phi_{h2}$ | | 45 | 4 | −3 | 8 |
| $D_\parallel^1$ | 1 | 0.89 | 0.84 | 0.81 $\phi_{h2}$ | | 90 | 77 | 97 | 187 |

TABLE 1-continued

Simulation values for fibers oriented at 90 degrees.

| | 1 Hindered + 2 Restricted Model | | | | 2 Hindered (Two-tensor) | | | | |
|---|---|---|---|---|---|---|---|---|---|
| | Simulation | Fitted Values | | | | Simulation | Fitted Values | | |
| # Directions | Values | 31 | 20 | 6 | # Directions | Values | 31 | 20 | 6 |
| Noise Floor | 0.03 | 0.03 | 0.024 | 0.005 | | | | | |
| Fit Error[2] | — | 7.58 | 12.5 | 32.8 | Fit Error | — | 18.1 | 21.5 | 25.3 |

TABLE 2

Simulation values for fibers oriented at 30 degrees.
1 Hindered + 2 Restricted Model

| | Simulation | Fitted Values | | |
|---|---|---|---|---|
| # Directions | Values | 31 | 20 | 6 |
| $f_h$ | 0.7 | 0.69 | 0.70 | 0.69 |
| $\lambda_{//}^1$ | 0.8 | 0.81 | 0.67 | 0.57 |
| $\lambda_{\perp}^1$ | 0.3 | 0.31 | 0.31 | 0.28 |
| $f_{r1}$ | 0.15 | 0.14 | 0.13 | 0.13 |
| $f_{r2}$ | 0.15 | 0.17 | 0.17 | 0.18 |
| $\Phi_{r1}$ | 30 | 26 | 39 | 45 |
| $\phi_{r1}$ | 90 | 89 | 91 | 77 |
| $\Phi_{r2}$ | 60 | 58 | 62 | 53 |
| $\phi_{r2}$ | 90 | 29 | 87 | 63 |
| $D_{//}^1$ | 1 | 0.85 | 1.28 | 3.00 |
| Noise Floor | 0.03 | 0.023 | 0.031 | 0.023 |
| Σ Residuals | — | 5.33 | 6.53 | 26.0 |

A Gradient Scheme for Human Imaging

In general, the CHARMED methods as described above are applied to MR measurements obtained at high and low b values. In addition, because CHARMED methods provide indications of specimen structure, MR measurements to which these methods are applied are preferably associated with high angular resolution. One suitable gradient scheme for obtaining MR data suitable for CHARMED methods includes approximately ten shells of q-values. The first shells are associated with a lower angular resolution (for example, 6-12 directions) and outer shells (higher q-values) are associated with a higher angular resolution (24-31 directions).

A representative gradient sequence that can be provided with a 3T scanner is based on TR=2700 ms, TE=155 ms, Δ=53 ms, δ=47 ms, and a maximum gradient field magnitude $G_{max}$=3.4 Gauss/cm. Ten axial slices can be obtained with two averages. Field of view can be selected to be 19 cm, slice thickness to be 3 mm, and cubic resolution as $(3 \text{ mm})^3$. A total of 169 gradient applications can be used in an acquisition time of about 6 minutes. Gradient directions and associated b-values are summarized in Table 3.

TABLE 3

Scan Parameters

| b-value (s/mm²) | No. of directions |
|---|---|
| 0 | 1 |
| 714 | 6 |
| 1428 | 6 |
| 2285 | 12 |
| 3214 | 12 |
| 4286 | 16 |
| 5357 | 16 |
| 6429 | 20 |
| 7500 | 20 |
| 8571 | 30 |
| 10000 | 30 |

Figure 25A:
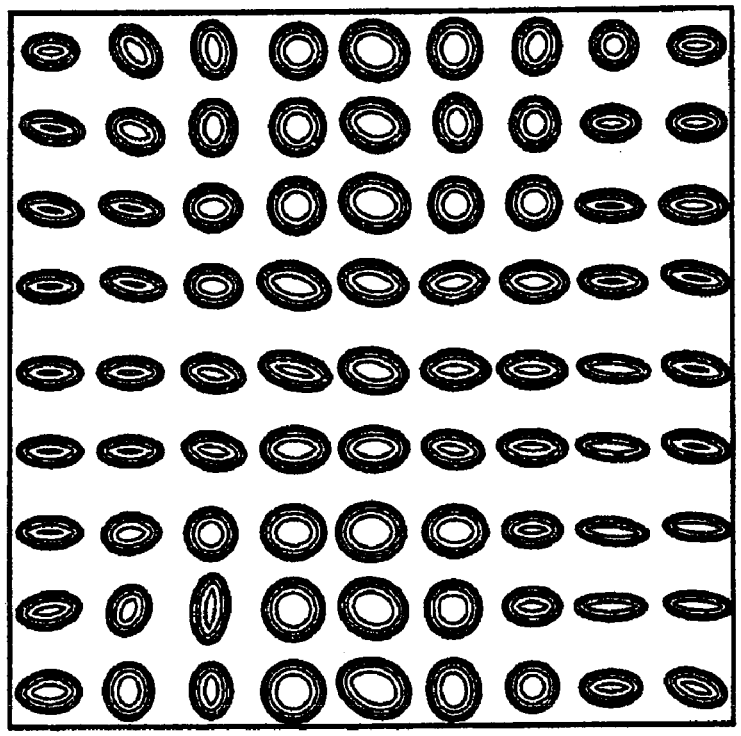
FIGS. 25A-25B illustrate iso-probability surfaces as a function of position in an image of a human brain based on conventional DT imaging, and a composite hindered and restricted method (CHARMED), respectively.
Figure 25B:
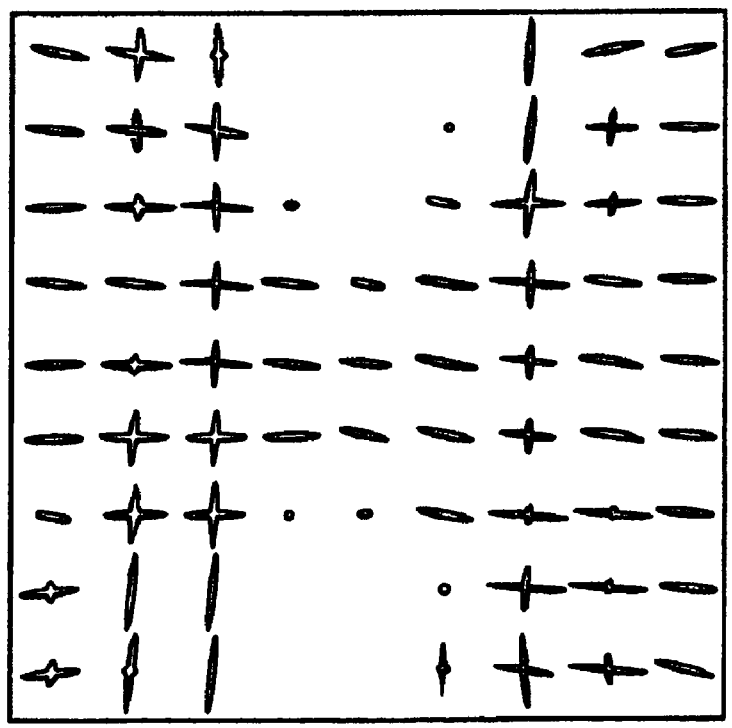

Using this set of sequences, displacement iso-probabilities at some or all image locations can be determined. FIGS. 25A-25B illustrate such iso-probability surfaces as a function of position in an image of a human brain based on conventional DT imaging, and a composite hindered and restricted method (CHARMED), respectively. Referring to FIG. 25B, fiber orientation can be tracked even in regions where fibers cross. Conventional DT imaging, illustrated in FIG. 25A (based on a hindered compartment) does not permit such fiber tracking. Representative data and CHARMED data fits (one hindered compartment and one restricted compartment) can also be shown for various directions.

As shown above, signal attenuation observed at high and low q in coherent white matter can be modeled based by dividing spins into those exhibiting hindered diffusion and restricted diffusion. The hindered component can be modeled using a Gaussian distribution based on principal diffusivities that are parallel and perpendicular to an axonal axis or other axis. The restricted component can be modeled as a Gaussian distribution for diffusion parallel to the local axonal axis or other axis, and a distribution associated with restricted diffusion selected for directions perpendicular to the local axonal axis.

Evaluation of parameters associated with restricted and/or hindered diffusion can be used in the assessment of properties of various specimens. For example, estimation of a local direction associated with restricted diffusion can be used to assess local axonal orientation. Orientation of specimens of other geometries can be similarly estimated. As noted above, properties of macroscopically isotropic but microscopically anisotropic materials such as brain gray matter can be assessed. Diameter distributions of axons having cylindrical cross-sections can be estimated, and geometric properties of other volumes associated with restricted diffusion can be estimated. For example, a distribution of distances between parallel planes that serve as diffusion boundaries can be estimated. Such distributions can be used, for example, to assess tissue degeneration or other specimen properties. For example, some diseases reduce numbers of larger or smaller diameter axons, and measurements of such distribution can be used in diagnosis and treatment.

The methods and apparatus are described with respect to parameter estimation in brain white matter, but structural evaluation as provided by these methods and apparatus can be used in numerous other applications. For example, neurodegeneration such the axon demyelination associated with multiple sclerosis can be identified. A cancer treatment can be evaluated based on diffusion changes produced in response to the treatment. The efficacy of drugs and other treatments can be evaluated based on such structural evaluations. Identification and evaluation of restricted diffusion in anisotropic specimens can also be used in neonatal screening, drug screening, food processing, and other clinical and industrial applications. In other examples, fiber connectivity, white-matter integrity, and fiber-tracking in the vicinity of brain lesions can be evaluated. These methods could also be applied to myocyte diameter distribution measurements in muscles. The methods presented herein can be applied to the evaluation and characterization of other anisotropic specimens that exhibit hindered and restricted diffusion.

The CHARMED methods can provide estimates of population fractions in hindered and/or restricted compartments. Such fractions are typically obtained based on T1 and T2-weightings, and can differ from population fractions estimated by other methods. In addition, in white-matter MR imaging, the hindered compartment typically includes contributions from glia and astrocytes. One or more compartments can be associated with two or more, or a spectrum of T2 values. In the examples presented above, diffusion in a restricted compartment is associated with axes along which diffusion can be modeled as being statistically independent. Such modeling is appropriate for many specimens such as tubes, spheres, and parallel plates. For specimens with restricted compartments having irregular, fractal, or partially reflecting boundaries, statistical independence is inappropriate for motion perpendicular to and parallel to the compartment boundary in a local principal frame of reference.

CHARMED methods can also provide estimates of other diffusion-related properties such as principal diffusivities in addition to T2 or other weighted population fractions. In addition, CHARMED methods can provide specimen analysis based primarily on one or more restricted compartments, and the typically large signal contributions associated with a hindered compartment can be neglected.

Exemplary methods are described above, but these examples can be modified in arrangement and detail. For example, the effects of gradient pulses that are sufficiently long enough to permit substantial translational spin diffusion during the pulses can be included. Translational diffusion of spins in a fast-exchange limit can be modeled, and fiber-diameter distributions can be estimated. In addition, an intra-axonal axis and extra-axonal axis need not be collinear. Specimens other than nerve fiber can be evaluated, and restricted diffusion volumes having shapes other than cylindrical can be modeled. In some applications, MR signals or images include signal distortions that can be removed prior to or subsequent to modeling. In particular, for large q-values, signal distortions associated with eddy currents can be significant. Examples described above pertain to the fast- and slow-exchange limits, but in other examples partial reflection or exchange between the hindered and restricted compartments can be included. Analysis of complex specimens such as the human brain can be based on more complex selections of hindered and restricted components than the two fibers.

Compartment Distributions

In many clinical and other applications, a distribution of compartment properties (such as size, diffusivity shape, orientation, volume, area, spin fraction) can serve as a convenient indicator of specimen structure for living or other specimens. For example, evaluations of nerve function in humans or other animals can be based on a distribution of axon diameters. In other examples, other size parameters such as length, width, radius, or other dimensions of spheres, rectangles, or other shapes having curved, elliptical, rectangular, polygonal, ovoid, or other cross-sectional shapes can be evaluated. Such distributions and evaluations based on such distributions can permit diagnosis or treatment in medical applications.

As discussed in detail above, an observed magnetic resonance signal $E(q,\Delta)$ can be expressed as:

$$E(q,\Delta)=f_h\cdot E_h(q,\Delta)+f_r\cdot E_r(q,\Delta),$$

wherein $f_h$ and $f_r$ are the hindered and restricted population fractions, respectively, $E_h$ is a signal contribution associated with a hindered component, $E_r$ is a signal associated with a restricted component, $\Delta$ is a diffusion time, $q=(1/2\pi)\gamma G_0\delta$, $G_0$ is a magnetic field gradient, $\delta$ is an effective pulse duration, and $\gamma$ is a gyromagnetic ratio.

The signal contribution $E_h$ can be expressed as:

$$E_h = \exp[-\gamma^2\delta^2 g^2 D_h(\Delta-\delta/3)].$$

The signal contribution $E_r$ can be expressed as:

$$E_r(q_\perp, \Delta) = \sum_k 4\exp[-\beta_{0k}^2 D_\perp \Delta/a^2] \times \left[\frac{(2\pi|q_\perp|a)J_0'(2\pi|q_\perp|a)}{(2\pi|q_\perp|a)^2 - \beta_{0k}^2}\right]^2 ++$$

$$\sum_{nk} 8\exp[-\beta_{nk}^2 D_\perp \Delta/a^2] \times \frac{\beta_{nk}^2}{\beta_{nk}^2 - n^2} \times \left[\frac{(2\pi|q_\perp|a)J_n'(2\pi|q_\perp|a)}{(2\pi|q_\perp|a)^2 - \beta_{nk}^2}\right]^2.$$

In typical examples, the numbers of terms in the sums can be limited by noting values of n and k for which contributions become sufficiently small.

For a distribution of feature sizes associated with hindered diffusion, the associated signal can be expressed as:

$$E_r(q_r, \Delta) = \frac{1}{\sum_i f_i \pi a_i^2}\left[\sum_i f_i \pi \right.$$

$$a_i^2 \left[\sum_k 4\exp[-\beta_{0k}^2 D_\perp \Delta/a_i^2] \times \left[\frac{(2\pi|q_\perp|a_i)J_0'(2\pi|q_\perp|a_i)}{(2\pi|q_\perp|a_i)^2 - \beta_{0k}^2}\right]^2 + \sum_{nk} 8 \right.$$

$$\left.\left.\exp[-\beta_{nk}^2 D_\perp \Delta/a_i^2] \times \frac{\beta_{nk}^2}{\beta_{nk}^2 - n^2} \times \left[\frac{(2\pi|q_\perp|a_i)J_n'(2\pi|q_\perp|a_i)}{(2\pi|q_\perp|a_i)^2 - \beta_{nk}^2}\right]^2\right]\right],$$

wherein $f_i$ and $a_i$ are population fraction and corresponding feature size for the population (for example, axon radius), respectively. While in some examples, the population fraction can be assumed to have a particular functional form, for example, a gamma-function, i.e., $$f_i(\alpha, \beta) = \frac{a_i^{\alpha-1} e^{-a_i/\beta}}{\beta^\alpha \Gamma(\alpha)},$$

in other examples, a population function can be obtained from the signals directly without imposing a particular functional form on the population. Such methods and apparatus are referred to as parametric and non-parametric, respectively. In some examples, parameters associated with the distribution can be obtained and used for evaluation. For example, a product αβ (a mean) determined based on a gamma distribution can be used, or other combinations of one or both of α or β.

Electromagnetic signals obtained by application of one or more static or time-varying magnetic fields to a specimen can be processed and recorded. In many examples, such electromagnetic signals are detected with one or more field coils, amplified, filtered, or otherwise processed, digitized, and recorded in one or more computer-readable media as one or more digital values. Processing of such electromagnetic signals can be performed either prior to digitization or after digitization, or both, as is convenient. Processing in a general purpose or special purpose computer based on stored computer-executable processing instructions is convenient. As used herein, "recorded signals" refers to digital or other stored representations of such electromagnetic signals.

Parametric methods can be based on any form of distribution deemed convenient. For example, Gaussian, gamma function, log-normal, or other distributions can be used. In some examples, determination of distribution parameters can serve as a basis for specimen evaluation and treatment. In other examples, moments of a distribution such a mean, mean square, or higher order moments can be determined, and specimen evaluations based on such determinations. Distribution parameters can also be used in segmenting, classifying or clustering tissues into regions having specific properties. Classifying, clustering, or other evaluations can be based on algorithms such the k-means algorithms or others. They can be used to perform hypothesis tests to make determinations and distinctions between different voxels or tissue regions. Typically parameters of restricted or hindered compartments, distributions of such parameters, moments of such distributions, or other specimen evaluations are communicated via a display or other visual device, an audio device, or via a network such as a local area network, a wide area network such as the Internet, or otherwise provided for clinical or other applications.

Although the methods disclosed herein can be used to interrogate specimens having hindered or restricted compartments having different properties along one or more directions, these methods are also generally applicable to specimens in which such compartments are spherical or other shapes having little or no directionality.

Figure 26:
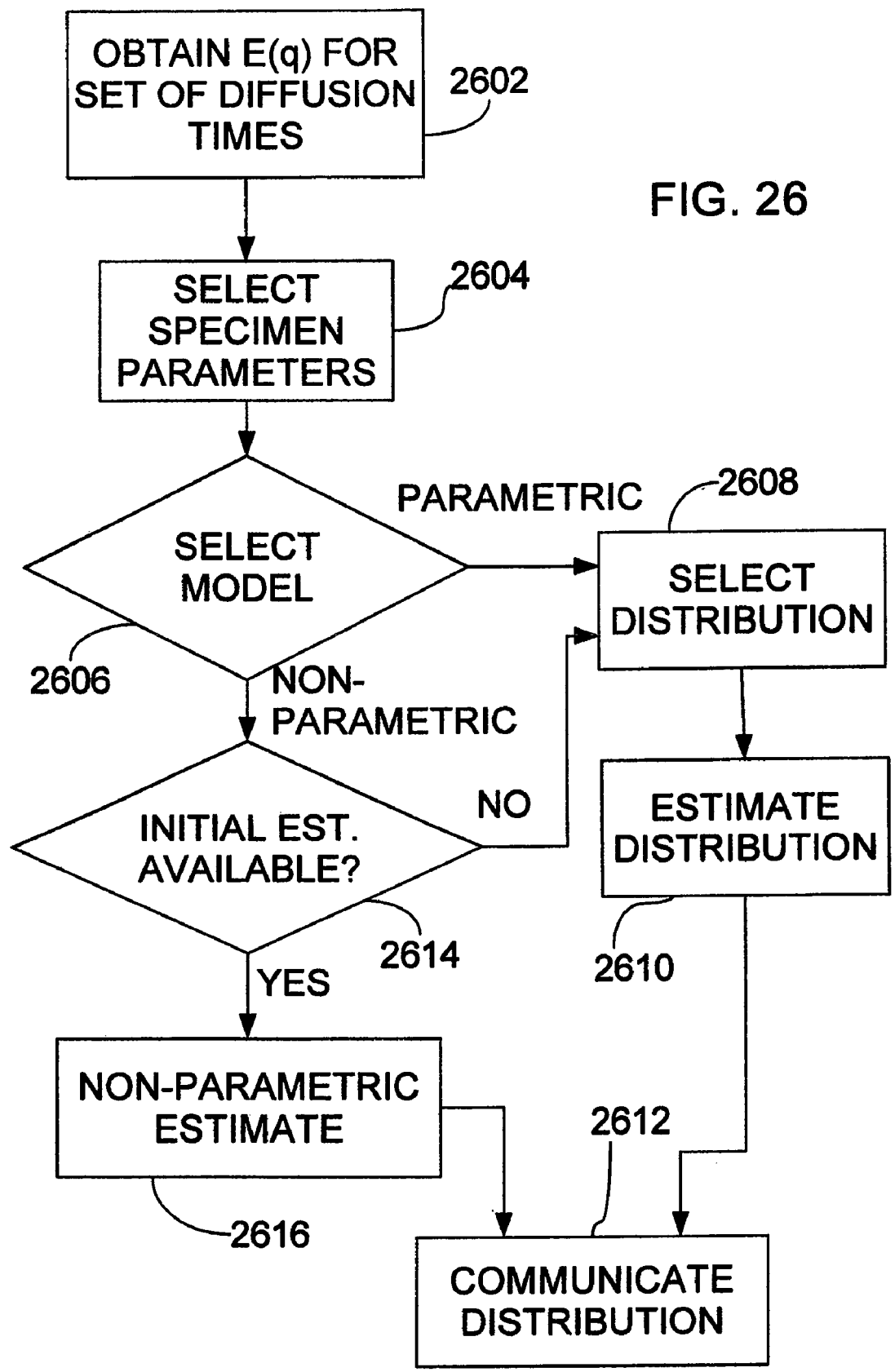
FIG. 26 illustrates a representative method of estimating a distribution associated with a characteristic parameter of restricted or hindered compartments of a specimen.

With reference to FIG. 26, in a step 2602 recorded signals E(q) are obtained for a plurality of values of q and diffusion times. In some examples, particular directions or parameters (spin fraction, compartment dimensions) are selected for investigation, and corresponding recorded signals E(q) are obtained. In a step 2604, one or more parameters are selected, and in a step 2606, either a parametric or non-parametric distribution determination is selected. If a parametric method is selected, in a step 2608, one or more particular function forms for the distribution are selected for the selected parameters. In a step 2610, the selected functional forms are fit to the recorded signals and an estimate for the distribution is obtained, and results are displayed or otherwise communicated in a step 2612. Typically, population fraction, diffusivity in the restricted compartments, and parameters associated with a selected distribution function (for example, α, β for a gamma distribution) are fit to the E(q) data using a non-linear least squares fit routine. In one example, Levenberg-Marquardt minimization can be used. In order to facilitate convergence, initial conditions can be selected that limit the distribution function.

If non-parametric analysis is selected in the step 2606, in a step 2614 the availability of an initial distribution is checked. If an initial distribution is not available, the process proceeds to the step 2608. If an initial distribution is available, a non-parametric estimate is produced in a step 2616, and the results communicated in the step 2612. In some examples, in the step 2616, a menu of non-parametric methods can be presented, and a user can select a preferred or otherwise convenient method such as those discussed below.

Figure 27B:
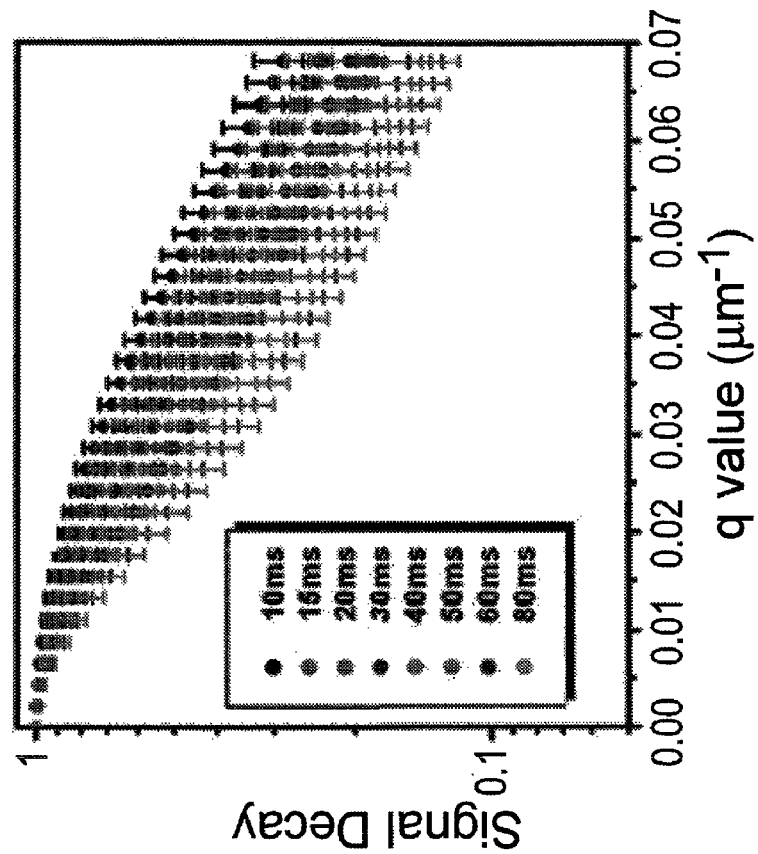
FIGS. 27A-27B are representative graphs of recorded magnetic resonance signals as a function of q for a variety of diffusion times ranging from 10 ms to 80 ms for a pig optic nerve and a pig sciatic nerve, respectively.
Figure 27A:
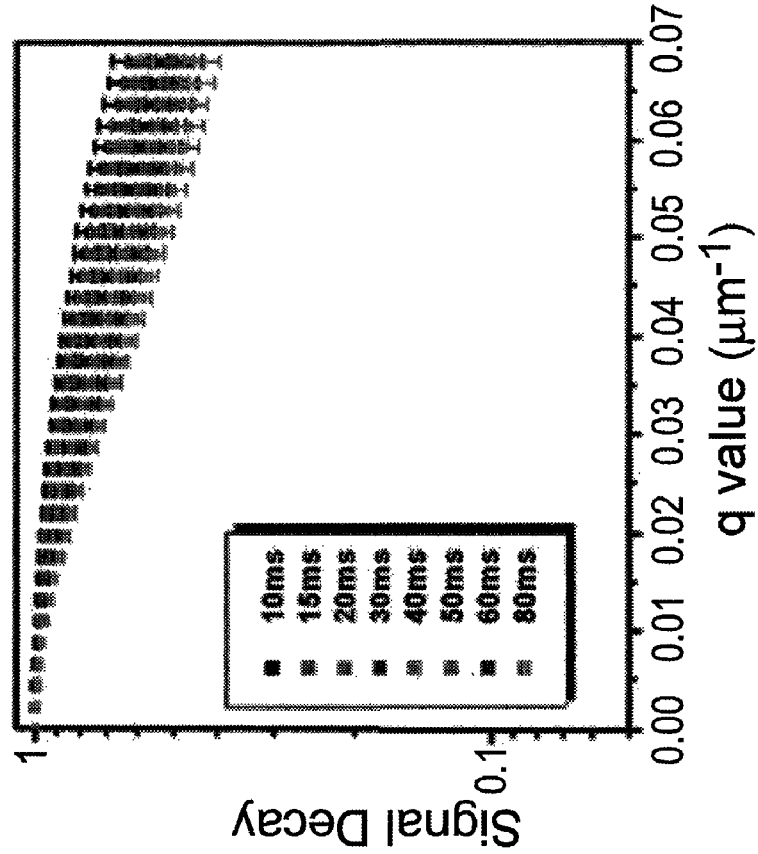

As an example, recorded signals were obtained for pig optic nerve and pig sciatic nerve specimens as shown in FIG. 27A-27B for diffusion perpendicular to the nerve fiber axis. The specimens were formalin-fixed, and placed in buffered saline for rehydration prior to MR signal acquisition. Signals were acquired in an 7 T static magnetic field, TR/TE=300/166 ms, $\delta$=2.5 ms, $G_{max}$=1200 mT/m, and eight signal acquisitions were averaged. The recorded signals were obtained for diffusion times of 10, 15, 20, 30, 40, 50, 60, and 80 ms for q values up to about 0.07/µm. Prior to any additional processing, the more rapid decay of the pig sciatic nerve signal as functions of both q value and diffusion time is apparent, and it likely that the optic nerve has a large population of small diameter axons exhibiting restricted diffusion even at the shortest diffusion times and the sciatic nerve has a broader distribution of axon diameters.

Figure 28:
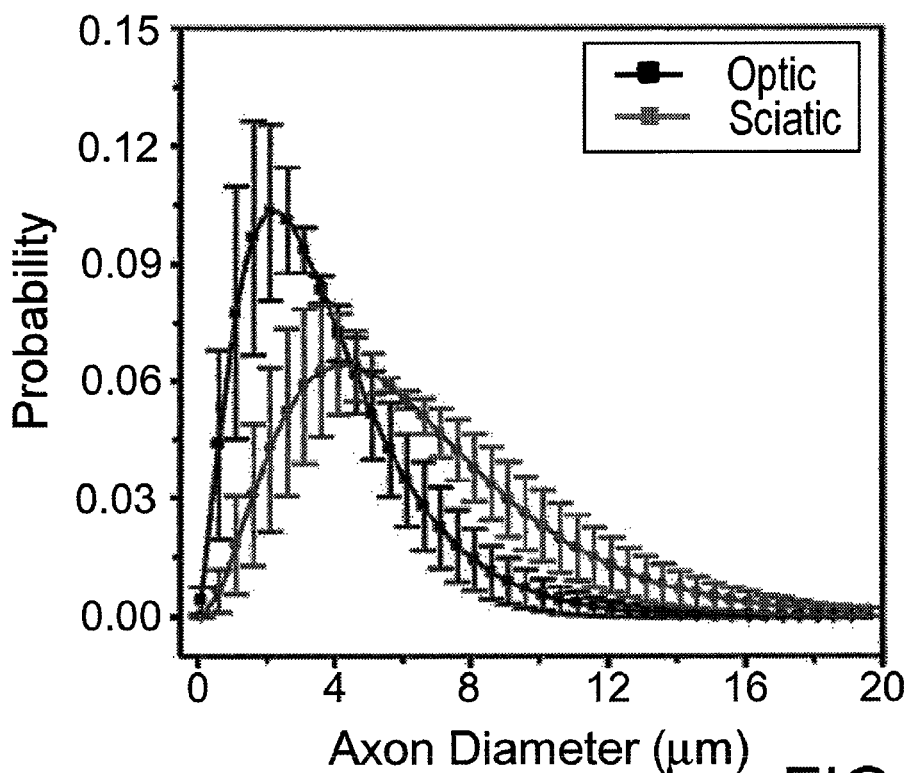
FIG. 28 is a graph illustrating gamma probability distributions of axon diameters based on the magnetic resonance signals illustrated in FIGS. 27A-27B.
Figure 29:
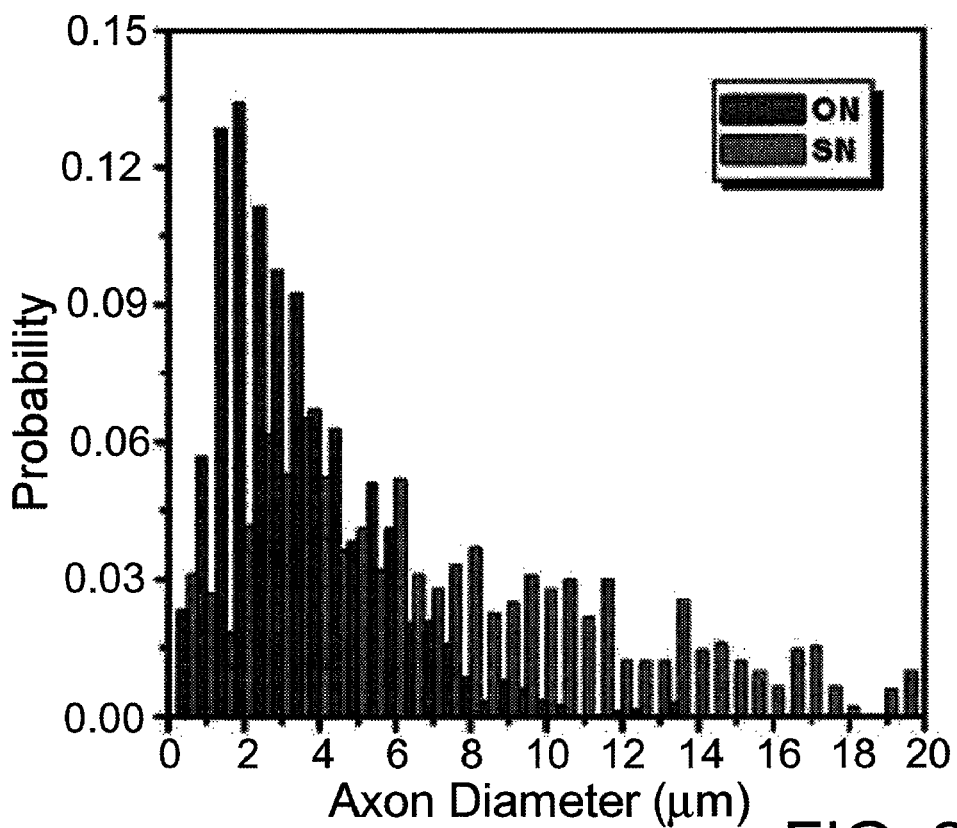
FIG. 29 is a graph illustrating axon diameter distributions obtained from electron microscope images of sections of pig optic nerve and sciatic nerve for comparison with the MR based distributions of FIG. 28.

Computed distributions based on non-linear least square fits with Levenberg-Marquardt minimization are shown in FIG. 28 for both optic and sciatic nerve specimens. For comparison, distributions based on electron microscope images of the similar specimens are shown in FIG. 29. MR based mean axon diameters were estimated to be 3.74 µm and 6.3 µm for pig optic nerve and sciatic nerve respectively. Corresponding electron microscope based means were 3.47 µm and 7.3 µm, respectively.

Figures 30A, 30B, 30C, 30D, 30E, 30F:
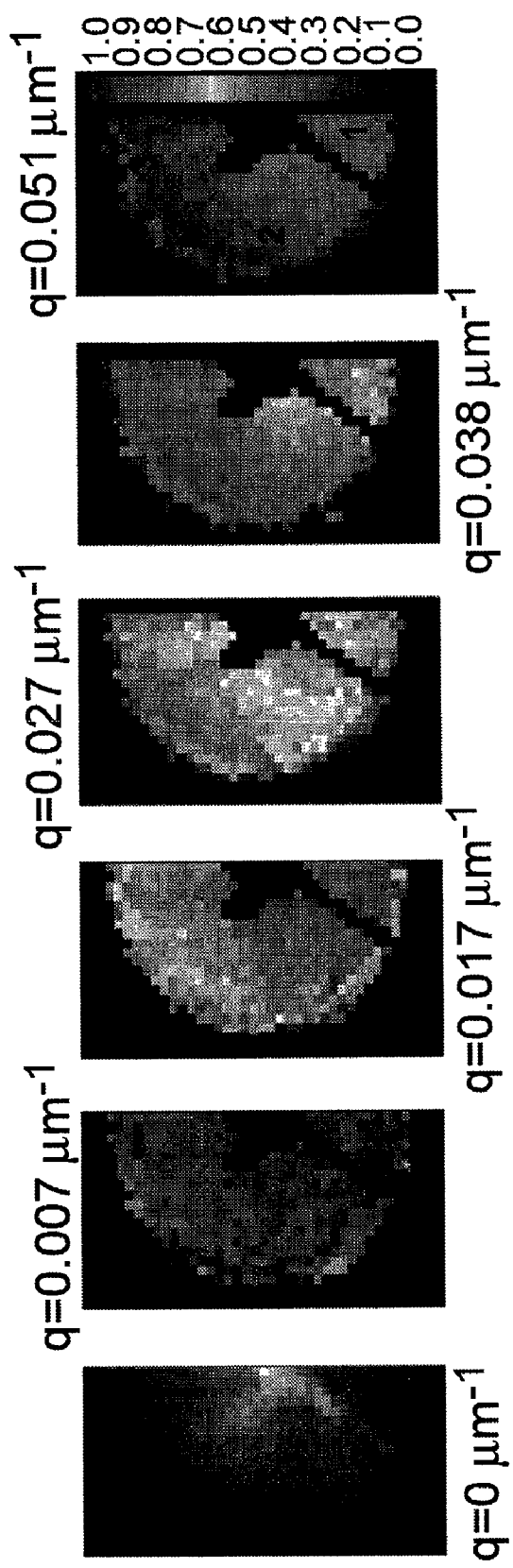
FIG. 30A is a diffusion weighted MR image of pig spinal cord with q=0 corresponding to a $T_2$ weighted MRI.
FIGS. 30B-30F are diffusion weighted images of pig spinal cord at different q values and a diffusion time of 120 ms normalized to the q=0 image of FIG. 30A. Signals E(q) for selected regions are labeled 1-3 (fasciculus gracilis (dorsal region), spinocerebellar and cortospinal fasciculi (lateral region), and spinotectalis, reticulospinal, and vestibulospinal fasciculi (rostral) regions respectively).

In another example, diffusion weighted imaging sequences were applied to pig spinal cord specimens with parameters TR/TE=3500/18 ms, $\delta$=4 ms, $G_{max}$=300 mT/m, and diffusion times of 12, 30, 60, 100, and 150 ms. Six signals were averaged. FIG. 30A is a T2 weighted image, and FIGS. 30B-30F are diffusion weighted images at a diffusion time of 120 ms at different q values. Signal decay as a function of q and the above range of diffusion times is shown in FIGS. 31A-31C for regions 1-3 noted in FIGS. 30B-30F. As can be noted from these figures, signal decay as a function of q and diffusion time is different in the three regions, and is increasingly noticeable with increasing q value. Axon diameter distributions can be obtained on a pixel by pixel basis to obtain, for example, α, β of a gamma distribution of axon diameters and intra- and extra-axonal volume fractions.

Axon diameter distributions can be used to evaluate or diagnose disorders or diseases such as ALS or autism, or to assess normal or abnormal development. In some evaluations, multimodal diameter distributions may be obtained that are not well characterized by a gamma distribution. For example, electron microscopy of sciatic nerve exposed to allergic neuritis shows a multimodal diameter distribution. Thus, in some examples, a different predetermined functional form of a diameter distribution or a non-parametric estimate of diameter distribution may be appropriate.

In one example, a distribution of axon diameters or other properties can be obtained that is not limited to distributions characterized by specific functional forms. For convenience in such non-parametric analysis, an initial distribution can be estimated based on a parametric analysis as described above. Thus, a distribution of axon diameters obtained based on a gamma distribution can be used to define an initial histogram of axon diameters by selecting a series of axon diameter bin widths and assigning relative amplitudes to each of the bins based on the computed gamma distribution. The amplitudes (and bin widths) can be varied to fit the recorded signals so as to obtain a distribution that is no longer limited to the functional form of the initial estimate. In one example, diffusion weighted recorded signals were obtained as described above, and a gamma function estimate of the axon diameter distribution was obtained and used to produce an initial histogram. Non-parametric histograms for pig optic nerve and pig sciatic nerve were generated, and are shown in FIGS. 32A-32B.

While a histogram can be estimated based on a computed parametric distribution function to obtain an estimate of an axon diameter distribution, in other examples, axon diameter distributions can be estimated based on initial parametric estimates using so-called kernel density estimators. Histograms generally are not smooth, and the exact shape of the histogram depends on bin width and locations of the bins. Smoother estimates with less dependence on bin location can be provided using various kernels such as, for example, uniform, triangular, Epanechnikov, quartic, triwidth, Gaussian, or cosine, rectangular, biweight, and optcosine kernels. Such kernel functions are generally associated with a width or bandwidth parameter h that determines the width of the kernel function. Typically a kernel function K(u) such as a Gaussian kernel function $$K(u) = \frac{1}{\sqrt{2\pi}} \exp(-u^2/2)$$

is used to provide an estimate of an axon diameter distribution as $$f(a) = \frac{1}{nh} \sum_{i=1}^{n} K\left(\frac{a-a_i}{h}\right),$$

wherein n is a number of data points. The bandwidth parameter can be selected to provide a diameter distribution that is as smooth as appropriate, and in one example, an optimal bandwidth is selected, wherein the optimal bandwidth $h_{opt}$ is given by:

$$h_{opt} = \frac{c_1^{-2/5} c_2^{1/5} c_3^{-1/5}}{n^{1/5}},$$

wherein
$c_1 = \int a^2 K(a) da$
$c_2 = \int K(a)^2 da$, and
$c_3 = \int (f'(a))^2 da$,
wherein f' is a second derivative of f(a) with respect to a.

Other non-parametric estimation methods can also be used such as, for example, data adaptive methods such as nearest neighbor methods or variable kernel methods. In nearest neighbor methods, a histogram bin width is varied to provide a predetermined number of samples in each bin. In some examples, a generalized nearest neighbor estimate is provided as a kernel estimate with a bandwidth that can vary. So-called minimum description length (MDL) based methods can also be used. These non-parametric methods are generally preferable to parametric methods for multi-modal distributions, or in evaluations in which specific portions of the diameter distribution is changed such as may occur in brain trauma or in some degenerative diseases such as ALS. Iterative methods are not required, nor are initial parametric estimates.

Once an axon diameter distribution for a specimen is obtained within a voxel, a set of voxels or an imaging volume, additional properties of the specimen can be determined based on the distribution. For example, the axon diameter distribution permits an estimate of local myelin content based on axon cross-sectional areas.

In other examples, axon diameter distributions in rat's corpus callosum were investigated. The corpus callosum is the largest white matter structure in the brain and has homogenous fibers compositions that are different in different regions: In a somato-sensory area or visual area, axons are relatively bigger (diameters>3 µm) while in frontal and temporal areas, axons are relatively smaller (diameters<2 µm). In this example, signals were modeled as:

$$E(q,\Delta) = f_h \cdot E_h(q,\Delta) + f_r \cdot E_r(q,\Delta) + f_{CSF} E_{CSF}(q,\Delta),$$

$$E_{CSF}(q,\Delta) = \exp[-\gamma^2 \delta^2 g^2 D_{CSF}(\Delta - \delta/3)],$$

and $f_{CSF}$ is a spin fraction associated with cerebrospinal fluid and $D_{CSF}$ is a diffusion constant associated with cerebrospinal fluid. The remaining terms have been described above in detail. Such signals are associated with parameters $D_h$, $f_h$ in the hindered compartment, $f_r$, $D_r$, α, β in the restricted compartment, and $f_{CSF}$ in the cerebrospinal fluid, assuming a gamma distribution in the restricted compartment. Using this assumption, the parameters α and β can be determined so that five free parameters $D_h$, $f_h$, α, β, and $f_{CSF}$ can be used in cluster analysis, Based on this cluster analysis, specimen portions can be associated with particular portions of the corpus callosum.

Stimulated echo measurements were made in vivo on 3 rats at 16 different b-values for each of five diffusion time (11 ms, 20 ms, 30 ms, 60 ms, and 100 ms using a gradient direction perpendicular to the nerve fibers. Diffusion gradients ranged from 0 to 282 mT/m, TR/TE=1500/23.5 ms, δ=3.2 ms, $b_{MAX}$=6050 s/mm², in a 7 T field.

Figure 33A:
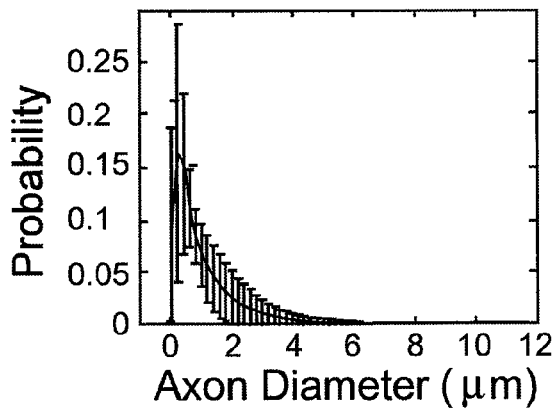
FIGS. 33A-33E are graphs of axon diameter distributions in a rat's corpus callosum obtained based on the restricted/hindered diffusion methods disclosed herein.
Figure 33B:
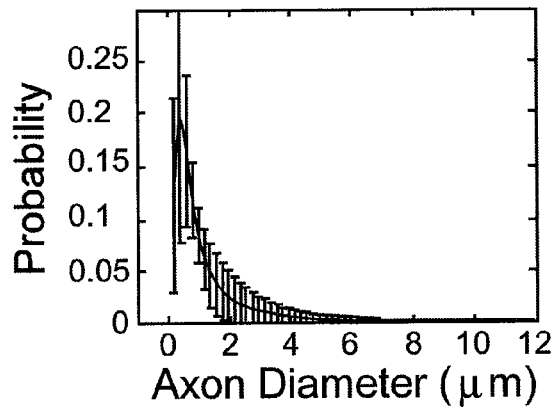
Figure 33C:
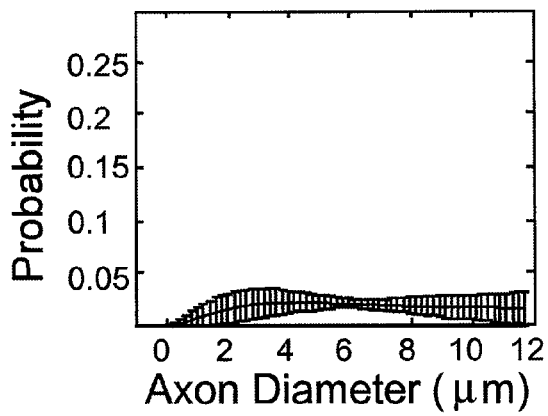
Figure 33D:
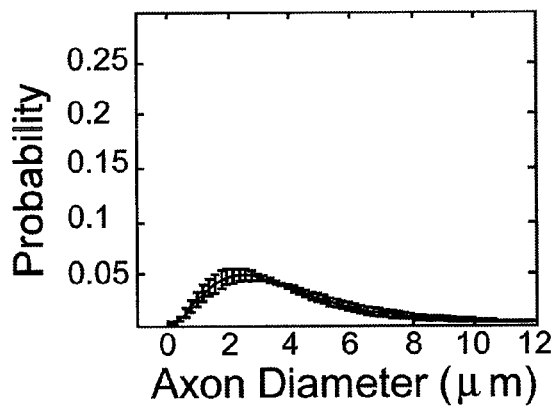
Figure 33E:
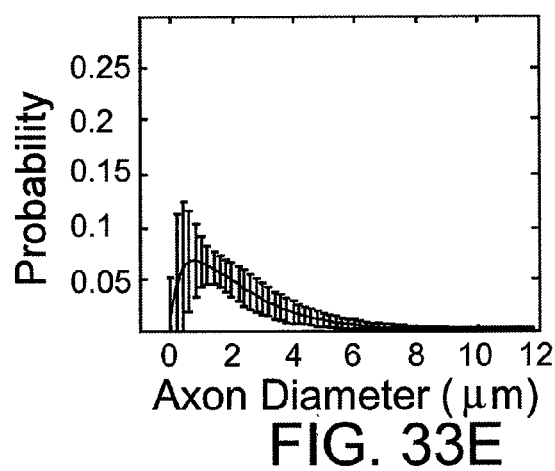
Figure 34A:
FIGS. 34A-34B are images of the rat's corpus callosum with similarly shaded regions exhibiting similar diameter distributions (based on k-means analysis).
Figure 34B:
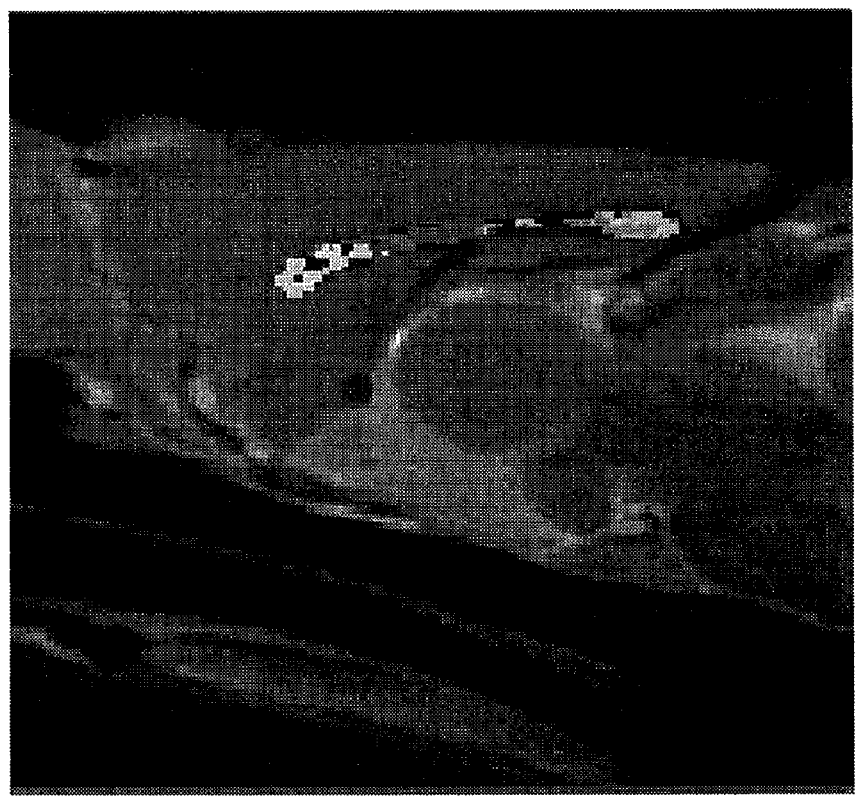

Axon diameter distributions are shown in FIGS. 33A-33E. FIG. 33A corresponds to a portion of the genu, FIGS. 33B-33C correspond to portions of the body, and FIGS. 33D-33E correspond to portion of the splenium. Images of the corpus callosum are shown in FIGS. 34A-34B, with similarly shaded regions exhibiting similar diameter distributions. In these measurement, contributions from axon diameters less than about 1 µm are limited due to signal-to-noise limitations, and limited MRI gradient strength.

While some specific examples are set forth above, it will be apparent that these and other features can be modified in arrangement and detail. For example, assessment of axon diameter distribution is only a convenient example, and distributions of other specimen properties associated with restricted and hindered compartments can be obtained such as orientation, length, width, diffusion constants, etc. Assessment of axon abnormalities associated with alcoholism, Alzheimer's disease, and aging can be provided. Axon distributions can also be used to evaluate brain connections due to the dependence of conduction velocity on axon diameter. From axon diameter distributions and axon trajectories one can measure latencies of nerve impulses between different parts of the CNS and PNS. Laboratory and in vivo distribution determinations can be made. Diameter distributions can also be used to evaluate muscle fibers to assess disease, development, and health. Meat products can be similarly evaluated to assess the effects of freezing or other meat processing, and diameter distributions of xylem and phloem in trees can be estimated non-invasively. Spin labeled gas molecules with long path lengths can be introduced into tube or bundles of tubes, and tube diameter distributions estimated. Accordingly, the disclosed examples are not to be taken as limiting, and we claim all that is encompassed by the appended claims.

We claim:

1. At least one non-transitory computer readable medium having stored thereon computer-executable instructions for a method comprising:
   obtaining a set of recorded translational diffusion-weighted magnetic resonance signals associated with a diffusion time and a plurality of non-zero q-values in a set of voxels in a sample, wherein q is proportional to a product of a magnitude and a duration of an applied pulsed magnetic-field gradient;
   identifying at least one restricted compartment of the sample based on variation in signal magnitudes in the set of signals as a function of the plurality of non-zero q-values;
   generating a non-parametric estimate of a distribution of at least one parameter characteristic of the at least one restricted compartment of the sample in each voxel of the set of voxels based on translational diffusion in the at least one restricted compartment of the sample; and
   based on an initial estimate, generating a final estimate of the distribution of the at least one characteristic parameter in each voxel of the set of voxels.

2. The at least one computer readable medium of claim 1, wherein the method comprises providing the initial estimate based on a parametric distribution function.

3. The at least one computer readable medium of claim 2, wherein the method further comprises identifying portions of a specimen having similar distributions.

4. The at least one computer readable medium of claim 2, wherein the set of signals is a set of image signals.

5. The at least one computer readable medium of claim 2, wherein the characteristic parameter associated with the restricted compartments corresponds to an orientation of the at least one restricted compartment.

6. The at least one computer readable medium of claim 2, wherein the set of recorded translational diffusion-weighted magnetic resonance signals is associated with a plurality of diffusion times.

7. The at least one computer readable medium of claim 2, wherein the set of recorded translational diffusion-weighted magnetic resonance signals is associated with a selected direction in the sample, and the distribution is associated with a characteristic parameter in the selected direction.

8. The at least one computer readable medium of claim 2, wherein the characteristic parameter associated with the restricted compartments corresponds to a dimension of the restricted compartment.

9. The at least one computer readable medium of claim 2, further comprising providing an estimated parameter associated with a distribution of hindered compartments.

10. A computer-implemented method of analyzing nerve fibers, comprising:
    obtaining, using a processor, a non-parametric estimate of a distribution of a nerve fiber characteristic parameter in each voxel of a plurality of specimen voxels based on signal magnitude attenuation as a function of q-value in a plurality of diffusion weighted magnetic resonance signals obtained at a plurality of non-zero q-values, wherein q is proportional to a product of a magnitude and a duration of an applied pulsed magnetic-field gradient;
    comparing, using the processor, the estimated distribution with a reference distribution; and
    based on the comparison, providing an assessment of the nerve fibers.

11. The method of claim 10, wherein the nerve fiber parameter is selected from the group consisting of nerve fiber orientation and nerve fiber diameter.

12. The method of claim 10, wherein the estimated distribution is obtained based on an initial distribution estimate.

13. The method of claim 12, further comprising obtaining the initial estimate based on a distribution function.

14. A magnetic resonance apparatus, comprising:
    a magnet configured to produce a static magnetic field along an axis so as to at least partially orient the specimen spins with the axis;
    a signal generator configured to produce at least one time varying magnetic field configured to direct the oriented spins so as to be at least partially parallel to a plane perpendicular to the static magnetic field;
    a pulsed-gradient field controller configured to apply pulsed-gradient fields having a plurality of magnitudes in a plurality of directions;
    a signal detector configured to receive and record a plurality of magnetic resonance signals associated with applied pulsed-gradient fields at a plurality of non-zero q-values in a set of specimen voxels, wherein q is proportional to a product of a magnitude and a duration of an applied pulsed magnetic-field gradient; and
    a processor configured to produce an initial estimate a distribution of at least one geometric parameter in each voxel of the set of specimen voxels associated with translational diffusion in a compartment of a specimen exhibiting restricted translational diffusion based on a dependence of the recorded magnetic resonance signals on at least two non-zero q-values, and produce a final estimate based on the initial estimate.

15. The apparatus of claim 14, wherein the processor is configured to produce the initial estimate based on a parametric distribution function.

16. The apparatus of claim 15, wherein the processor is configured to provide the final estimate non-parametrically from the initial distribution.

17. The apparatus of claim 16, wherein the parameter is a restricted compartment dimension.

18. A diagnostic method, comprising:
    using a processor to obtain a plurality of recorded diffusion weighted magnetic resonance signals associated with at least one diffusion time and a plurality of non-zero q-values;
    using the processor to estimate an initial distribution of a dimension of restricted compartment dimensions in a specimen within each voxel of a plurality of image voxels based on a predetermined distribution function and magnetic resonance signal attenuation as a function of q-value, wherein q is proportional to a product of a magnitude and a duration of an applied pulsed magnetic-field gradient;
    producing a final distribution estimate based on the initial estimate; and
    communicating a specimen assessment based on the final distribution.

19. The method of claim 18, further wherein the assessment is based on a portion of the final distribution associated with a range of parameter values.

20. The method of claim 19, wherein the parameter is a diameter, and the range of parameter values is a range of diameters.

21. The method of claim 18, wherein the plurality of recorded diffusion weighted magnetic resonance signals is associated with a plurality of diffusion times.

22. The method of claim 18, wherein the specimen includes nerve fibers, and further comprising identifying orientations of a first population of nerve fibers and a second population of nerve fibers in at least one volume element associated with the plurality of recorded diffusion weighted magnetic resonance signals.

* * * * *